United States Patent [19]
Yamamoto et al.

[11] Patent Number: 5,987,989
[45] Date of Patent: Nov. 23, 1999

[54] SEMICONDUCTOR PHYSICAL QUANTITY SENSOR

[75] Inventors: Toshimasa Yamamoto, Bisai; Kenichi Ao, Tokai; Yukihiro Takeuchi, Aichi-ken, all of Japan

[73] Assignee: Denso Corporation, Kariya, Japan

[21] Appl. No.: 08/795,402

[22] Filed: Feb. 5, 1997

[30] Foreign Application Priority Data

Feb. 5, 1996 [JP] Japan .................................. 8-019192

[51] Int. Cl.⁶ .............................................. G01P 15/125
[52] U.S. Cl. ................................... 73/514.24; 73/514.32; 361/280
[58] Field of Search ..................... 73/514.18, 514.32, 73/514.24, 514.38; 257/415; 361/280

[56] References Cited

U.S. PATENT DOCUMENTS

| 5,461,916 | 10/1995 | Fujii et al. |
|---|---|---|
| 5,465,604 | 11/1995 | Sherman . |
| 5,540,095 | 7/1996 | Sherman et al. . |
| 5,756,901 | 5/1998 | Kurle et al. ......................... 73/514.32 |

FOREIGN PATENT DOCUMENTS

| 0591554 | 4/1994 | European Pat. Off. . |
|---|---|---|
| 0605300 | 7/1994 | European Pat. Off. . |
| 6-123628 | 5/1994 | Japan . |
| 6-44008 | 6/1994 | Japan . |
| 7-98327 | 4/1995 | Japan . |
| 92/03740 | 3/1992 | WIPO . |

*Primary Examiner*—John E. Chapman
*Attorney, Agent, or Firm*—Pillsbury, Madison & Sutro

[57] ABSTRACT

A semiconductor physical quantity sensor includes a substrate and a beam structure having movable electrodes and spacing a given distance from an upper surface of the substrate. First fixed electrodes and second fixed electrodes are fixedly provided on the upper surface of the substrate. Each first fixed electrode faces one side of the corresponding movable electrode, while each second fixed electrode faces the other side of the corresponding movable electrode. A laminated structure of a lower layer insulating film, conductive films and an upper layer insulating film is arranged at an upper portion of the substrate. The conductive layers form a first wiring pattern for the first fixed electrodes, a second wiring pattern for the second fixed electrodes and a lower electrode. The first wiring pattern is electrically connected to the first fixed electrodes via openings formed in the upper layer insulating film and anchors of the first fixed electrodes, respectively. The second wiring pattern is electrically connected to the second fixed electrodes via openings formed in the upper layer insulating film and anchors of the second fixed electrodes, respectively. The lower electrode is electrically connected to the beam structure via an opening formed in the upper layer insulating film and an anchor of the beam structure.

11 Claims, 21 Drawing Sheets

5,987,989

SEMICONDUCTOR PHYSICAL QUANTITY SENSOR

BACKGROUND OF THE INVENTION

1. Field of the Invention

The present invention relates to a semiconductor physical quantity sensor, having a beam-structure movable portion, for measuring a physical quantity, such as acceleration, yaw rate or vibration, and a method of producing such a sensor.

2. Description of the Prior Art

In general, a physical quantity sensor, such as an acceleration sensor, employs a so-called flexure beam so as to detect movement of a mass portion coupled to the beam upon application of a physical quantity to the mass portion.

There has been a demand for reduction in size and price of physical quantity sensors, such as acceleration sensors for use in automobile suspension controls, automobile air bags or the like. U.S. Pat. No. 5,465,604 or Japanese Second (examined) Patent Publication No. 6-44008 corresponding to the former discloses a differential capacitive semiconductor acceleration sensor having a polysilicon beam structure with electrodes, which may satisfy such a demand. The sensor of this type will be explained hereinbelow with reference to FIGS. 34–36. FIG. 34 is a perspective view of the sensor, FIG. 35 is a sectional view taken along line XXXV—XXXV in FIG. 34, and FIG. 36 is a sectional view taken along line XXXVI—XXXVI in FIG. 34.

Beams 132 rest above a silicon substrate 130, each extending between corresponding anchors 131 fixed on the substrate 130. A mass 133 is suspended by the beams 132, and movable electrodes 134 are projected from the mass 133. On the silicon substrate 130, a pair of fixed electrodes 135a and 135b are arranged relative to each of the movable electrodes 134. Specifically, the movable electrode 134 is interposed between the pair of fixed electrodes 135a and 135b so as to face them at opposite sides thereof. The movable electrode 134 and the corresponding fixed electrodes 135a and 135b form a pair of capacitors having capacitances C1 and C2, respectively, which serve to achieve a servo control of the movable electrode 134. The anchors 131, the beams 132, the mass 133 and the movable electrodes 134 are made of polysilicon, and the beams 132, the mass 133 and the movable electrodes 134 are disposed spacing a given distance from the surface of the silicon substrate 130. The fixed electrodes 135a and 135b are fixed on the substrate 130 at their ends through anchors 136, respectively. The foregoing members are formed on the silicon substrate 130 using a surface micro-machining technique.

An operation of the acceleration sensor thus structured for detecting acceleration will be briefly explained hereinbelow with reference to FIG. 35.

When acceleration is zero, each of the movable electrodes 134 is located at the middle point between the corresponding fixed electrodes 135a and 135b, and the capacitance C1 of the capacitor formed by the movable and fixed electrodes 134 and 135a and the capacitance C2 of the capacitor formed by the movable and fixed electrodes 134 and 135b are set equal to each other. Further, when acceleration is zero, a voltage V1 applied across the capacitor formed by the movable and fixed electrodes 134 and 135a and a voltage V2 applied across the capacitor formed by the movable and fixed electrodes 134 and 135b are also set equal to each other so that each movable electrode 134 is attracted to opposite sides, that is, toward the fixed electrodes 135a and 135b, with electrostatic forces F1 and F2 of the same magnitude, respectively. On the other hand, if acceleration is applied in a direction parallel to the surface of the substrate 130 so as to displace the movable electrode 134 relative to the fixed electrodes 135a and 135b, the capacitances C1 and C2 are caused to have different values so that the electrostatic forces F1 and F2 become unequal to each other. Then, the magnitudes of V1 and V2 are so controlled as to cause the electrostatic forces F1 and F2 to have values which displace the movable electrode 134 to the middle point between the fixed electrodes 135a and 135b to render C1 and C2 equal to each other. When C1 and C2 are rendered equal to each other, the applied acceleration and the electrostatic force (that is, a differential between F1 and F2) are balanced so that the magnitude of acceleration can be derived based on the controlled magnitudes of V1 and V2.

Fabrication of the acceleration sensor shown in FIG. 34 will be explained hereinbelow with reference to FIGS. 37 and 38. In FIG. 37, a sacrificial layer (silicon oxide film) 138 is deposited on a silicon substrate 137, and openings 139 are formed at given regions in the sacrificial layer 138. Then, a polysilicon film 140 is deposited on the sacrificial layer 138 including the openings 139 and patterned into a given shape. Further, as shown in FIG. 38, the sacrificial layer 138 is removed by etching to form an air gap 141 so that a beam structure of the polysilicon film 140 is achieved.

As described above, in the foregoing acceleration sensor shown in U.S. Pat. No. 5,465,604, the beam structure is formed of polysilicon, that is, polycrystalline silicon. However, mechanical materiality values of polycrystalline silicon are unknown so that the mechanical reliability thereof is less ensured as compared with monocrystalline silicon. Further, the beam structure is subjected to camber or warp due to internal stresses or a stress distribution generated upon formation of the polycrystalline silicon film on the silicon oxide film formed on the monocrystalline silicon substrate. This causes the fabrication of the beam structure to be difficult, causes the spring constant of the sensor to be changed, or the like.

On the other hand, the mechanical reliability may be improved by using an SOI (silicon-on-insulator) substrate and monocrystalline silicon as a beam structure. The sensor of this type will be explained hereinbelow with reference to FIGS. 39–41. FIG. 39 is a plan view of the sensor, FIG. 40 is a sectional view taken along line XXXX—XXXX in FIG. 39, and FIG. 41 is a sectional view taken along line XXXXI—XXXXI in FIG. 39.

In this acceleration sensor, a vibration mass 147 is coupled to stationary supporters 146 via flexible beams 145 so that the vibration mass 147 is allowed to displace. The vibration mass 147 is formed of monocrystalline silicon doped with P (phosphorus). The stationary supporters 146 are fixed on a monocrystalline silicon substrate 148 in an electrically insulated state. The vibration mass 147 is provided with movable electrodes 149 extending in parallel to each other. The members 145, 146, 147 and 149 constitute a beam structure 150. Fixed electrodes 151 and 152 are arranged facing the movable electrodes 149, respectively, so as to define capacitances between the movable electrodes 149 and the fixed electrodes 151 and between the movable electrodes 149 and the fixed electrodes 152. With this arrangement, if acceleration is applied in a direction parallel to the surface of the substrate 148, such as in a direction Y in FIG. 39, the movable electrodes 149 displace relative to the fixed electrodes 151 and 152 via the flexible beams 145 so that the capacitances therebetween change.

Fabrication of the acceleration sensor shown in FIG. 39 will be explained hereinbelow with reference to FIGS.

42–46. In FIG. 42, in order to form an SIMOX layer on the monocrystalline silicon substrate 148, oxygen ions ($O^+$ or $O_2^+$) of $10^{16}$–$10^{18}$ dose/$cm^2$ are implanted in the substrate 148 at 100 keV–1,000 keV, and the ion-implanted substrate 148 is subjected to heat treatment at 1,150° C.–1,400° C. Through the foregoing process, an SOI substrate having a silicon oxide layer 153 of about 400 nm in thickness and a surface silicon layer 154 of about 150 nm in thickness is formed. Then, as shown in FIG. 43, the silicon layer 154 and the silicon oxide layer 153 are partly removed through photolithography and etching. Further, as shown in FIG. 44, a monocrystalline silicon layer 155 is epitaxially deposited in thickness of 1 $\mu$m–100 $\mu$m (normally, 10 $\mu$m–20 $\mu$m). Subsequently, as shown in FIG. 45, after formation of a metal film on the monocrystalline silicon layer 155, the metal film is formed into electrodes 156 of given shapes through photolithography for connection to a measuring circuit. Further, as shown in FIG. 46, the reactive vapor phase dry etching is applied to the monocrystalline silicon layer 155 so as to form the fixed electrodes 151 and 152, the movable electrodes 149 and so on. Finally, the silicon oxide layer 153 is removed through the HF liquid phase etching so as to provide the movable beam structure 150.

However, if the servo control as performed in the acceleration sensor shown in U.S. Pat. No. 5,465,604 is performed using the SOI substrate, it is necessary that the silicon substrate is formed with wiring using an impurity diffusion layer for crossing a first fixed electrode energization line and a second fixed electrode energization line. Specifically, as shown in FIGS. 47 and 48, a silicon substrate 160 is provided with a comb-shaped movable member 157 having rod electrodes 157a extending in parallel to each other above the silicon substrate 160. On the silicon substrate 160, first fixed electrodes 158 and second fixed electrodes 159 are further arranged such that each of the first fixed electrodes 158 faces one side of the corresponding rod electrode 157a while each of the second fixed electrodes 159 faces the other side of the corresponding rod electrode 157a. Further, the second fixed electrodes 159 are connected to each other (formed into a comb-shaped electrode) on the silicon substrate 160, while the first fixed electrodes 158 are electrically connected to each other through an impurity diffusion layer 161 formed on the silicon layer 160. However, in this case, leakage current is generated at the impurity diffusion layer 161 so as to render it difficult to detect acceleration with accuracy. Particularly, the acceleration detection is liable to be influenced by the leakage current at high temperatures.

In general, the silicon oxide film is used for the insulating layer. However, in the sacrificial layer etching process for rendering the beam structure movable, it is difficult to control the etching amount in a transverse direction upon removing the silicon oxide film (sacrificial layer). Accordingly, it is difficult to control lengths of the beams so that spring constants of the beam structures may differ from each other. Specifically, it is difficult to accurately control the concentration and the temperature of an etchant at constant values, and it is also difficult to accurately control the termination of etching. Thus, when leaving portions of the silicon oxide layer (sacrificial layer) as the anchors, it is difficult to process the beams into a given shape.

SUMMARY OF THE INVENTION

Therefore, it is an object of the present invention to provide an improved semiconductor physical quantity sensor.

It is another object of the present invention to provide an improved semiconductor physical quantity sensor producing method.

According to one aspect of the present invention, a semiconductor physical quantity sensor comprises a substrate; a beam structure made of a monocrystalline semiconductor material and spacing a given distance from an upper surface of the substrate so as to be displaceable in response to an applied physical quantity; and a fixed electrode fixed to the upper surface of the substrate and facing at least a portion of the beam structure, wherein a laminated structure including a lower layer insulating film, a conductive film and an upper layer insulating film is provided at an upper portion of the substrate, and wherein the conductive film forms wiring or an electrode which is electrically connected to an electrical connecting member arranged at the upper surface of the substrate, via an opening formed in the upper layer insulating film.

According to another aspect of the present invention, a semiconductor physical quantity sensor comprises a substrate; a beam structure made of a monocrystalline semiconductor material and spacing a given distance from an upper surface of the substrate, the beam structure having movable electrodes extending in parallel to each other; first fixed electrodes fixed to the upper surface of the substrate and each facing one side of corresponding one of the movable electrodes; and second fixed electrodes fixed to the upper surface of the substrate and each facing the other side of corresponding one of the movable electrodes, each of the movable electrodes and the corresponding first fixed electrode forming a first capacitor, and each of the movable electrodes and the corresponding second fixed electrode forming a second capacitor, wherein a laminated structure including a lower layer insulating film, a conductive film and an upper layer insulating film is arranged at an upper portion of the substrate, wherein the conductive film forms at least one of a wiring pattern for the first fixed electrodes and a wiring pattern for the second fixed electrodes, and wherein the at least one of the wiring patterns is electrically connected to the corresponding first or second fixed electrodes, respectively, via openings formed in the upper layer insulating film and anchors of the corresponding first or second fixed electrodes.

It may be arranged that the conductive film is made of polysilicon.

According to another aspect of the present invention, a semiconductor physical quantity sensor comprises a substrate; a beam structure made of a monocrystalline semiconductor material and spacing a given distance from an upper surface of the substrate, the beam structure having movable electrodes extending in parallel to each other; first fixed electrodes fixed to the upper surface of the substrate and each facing one side of corresponding one of the movable electrodes; second fixed electrodes fixed to the upper surface of the substrate and each facing the other side of corresponding one of the movable electrodes; and an electrostatic force preventing fixed electrode formed at a region of the substrate facing the beam structure, wherein a physical quantity applied to the beam structure is detected based on a capacitance of a first capacitor formed between each of the movable electrodes and the corresponding first fixed electrode and a capacitance of a second capacitor formed between each of the movable electrodes and the corresponding second fixed electrode, wherein generation of electrostatic forces between the beam structure and the substrate is prevented by setting the beam structure and the electrostatic force preventing fixed electrode to be equipotential to each other, wherein a laminated structure including a lower layer insulating film, conductive films and an upper layer insulating film is arranged at an upper portion of the substrate, wherein the conductive films form at least one of a wiring pattern for the first fixed electrodes and a wiring pattern for the second fixed electrodes and further form the electrostatic force preventing fixed electrode, wherein the at least one of the wiring patterns is electrically connected to the corresponding first or second fixed electrodes, respectively, via openings formed in the upper layer insulating film and anchors of the corresponding first or second fixed electrodes, and wherein the electrostatic force preventing fixed electrode is electrically connected to the beam structure via an opening formed in the upper layer insulating film and an anchor of the beam structure.

It may be arranged that voltages applied across the first and second capacitors are controlled so as not to displace the movable electrodes against the applied physical quantity, and that the applied physical quantity is detected based on the controlled voltages.

According to another aspect of the present invention, a semiconductor physical quantity sensor comprises a substrate; a beam structure made of a monocrystalline semiconductor material and spacing a given distance from an upper surface of the substrate, the beam structure having a first movable electrode at one side thereof and a second movable electrode at the other side thereof; a first exciting fixed electrode fixed to the upper surface of the substrate and facing the first movable electrode; a second exciting fixed electrode fixed to the upper surface of the substrate and facing the second movable electrode; and a physical quantity detecting fixed electrode formed at a region of the substrate facing at least a portion of the beam structure, wherein a physical quantity applied to the beam structure is detected based on a capacitance of a capacitor formed between the beam structure and the physical quantity detecting fixed electrode, while forcibly vibrating the beam structure by applying electrostatic forces in opposite phases between the first movable electrode and the first exciting fixed electrode and between the second movable electrode and the second exciting fixed electrode, wherein a laminated structure including a lower layer insulating film, conductive films and an upper layer insulating film is arranged at an upper portion of the substrate, wherein the conductive films form the physical quantity detecting fixed electrode and a wiring pattern therefor, and wherein the physical quantity detecting fixed electrode is electrically connected to an electrical connecting member provided at the upper surface of the substrate through the wiring pattern via an opening formed in the upper layer insulating film.

It may be arranged that the beam structure is made of monocrystalline silicon.

It may be arranged that the conductive films are made of polysilicon.

According to another aspect of the present invention, a method of producing a semiconductor physical quantity sensor comprises the steps of: forming a sacrificial layer and a first insulating film on a first semiconductor substrate; forming an anchor forming opening in a laminated structure including the sacrificial layer and the first insulating film; forming a conductive film at a given region on the first insulating film including the anchor forming opening; forming a second insulating film on the first insulating film including the conductive film; forming an attaching film on the second insulating film and flattening a surface of the attaching film; attaching a second semiconductor substrate to the flattened surface of the attaching film; polishing the first semiconductor substrate to a given thickness; removing an unnecessary portion of the first semiconductor substrate to form the first semiconductor substrate into a given shape; and removing the sacrificial layer at a given region through etching using an etchant so as to render the first semiconductor substrate movable.

According to another aspect of the present invention, a method of producing a semiconductor physical quantity sensor comprises the steps of: forming a groove at a given region in a first semiconductor substrate; forming a sacrificial layer and a first insulating film on the first semiconductor substrate including the groove; forming an anchor forming opening in a laminated structure including the sacrificial layer and the first insulating film; forming a conductive film at a given region on the first insulating film including the anchor forming opening; forming a second insulating film on the first insulating film including the conductive film; forming an attaching film on the second insulating film and flattening a surface of the attaching film; attaching a second semiconductor substrate to the flattened surface of the attaching film; polishing the first semiconductor substrate to a given thickness; and removing the sacrificial layer at a given region through etching using an etchant so as to render the first semiconductor substrate movable.

BRIEF DESCRIPTION OF THE DRAWINGS

The present invention will be understood more fully from the detailed description given hereinbelow, taken in conjunction with the accompanying drawings.

In the drawings.

DESCRIPTION OF THE PREFERRED EMBODIMENT

Now, preferred embodiments of the present invention will be described hereinbelow with reference to the accompanying drawings.

(First Embodiment)

The first preferred embodiment will be described hereinbelow with reference to FIGS. 1–16. In this embodiment, the present invention is applied to a servo-control differential capacitive semiconductor acceleration sensor.

Figure 1:
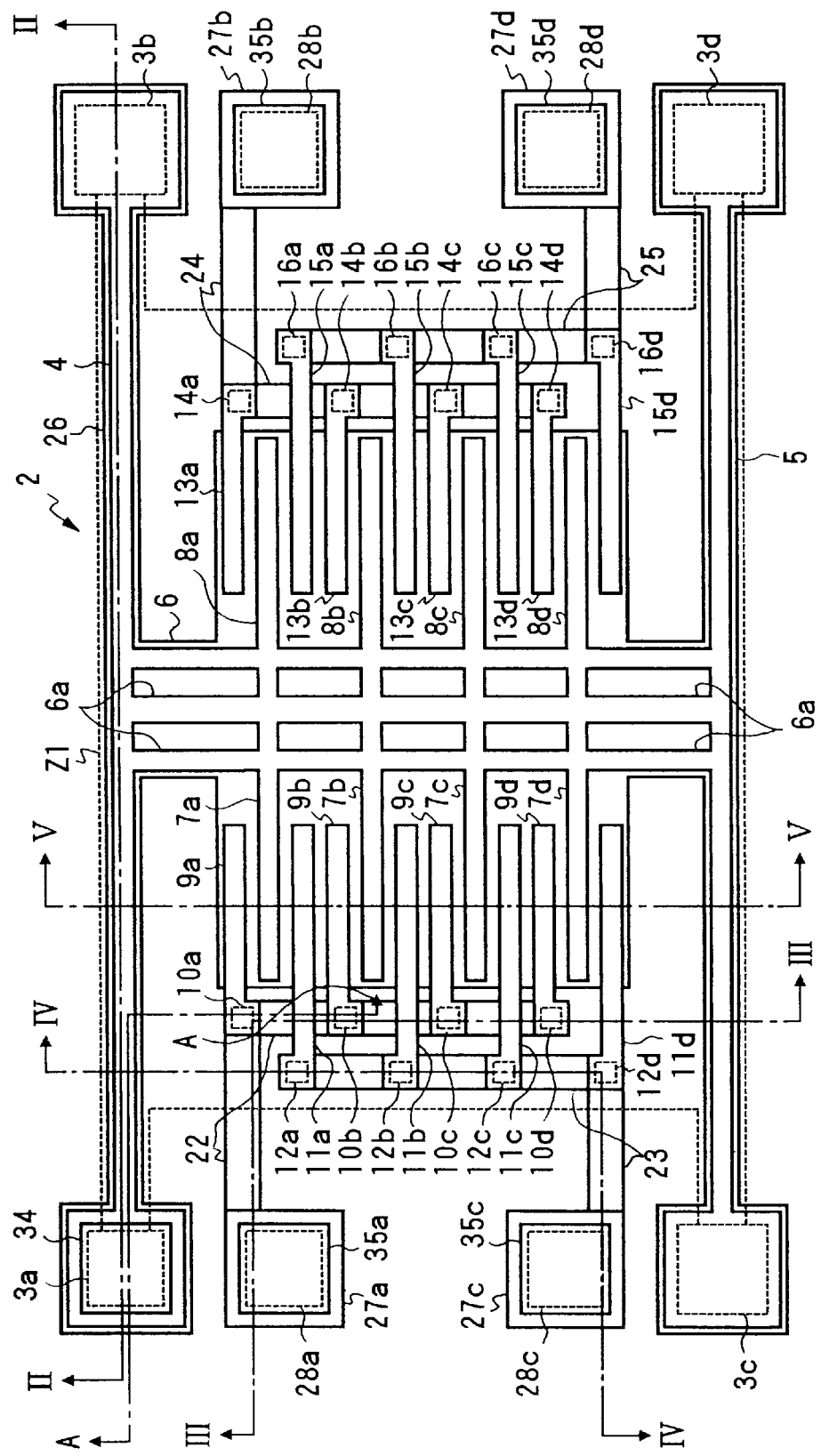
FIG. 1 is a plan view showing an acceleration sensor according to a first preferred embodiment of the present invention.
Figure 2:
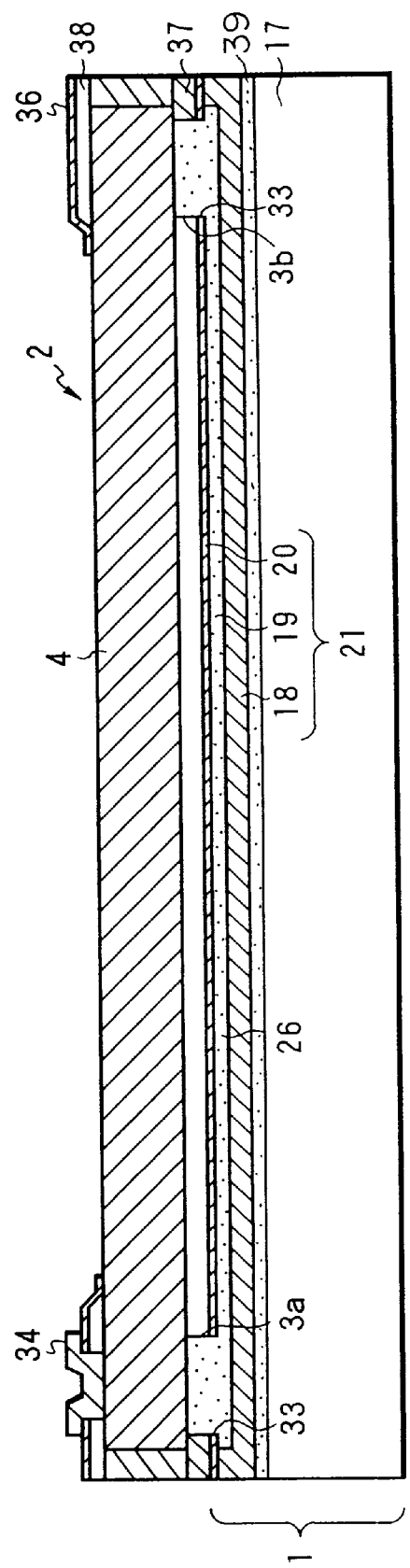
FIG. 2 is a sectional view taken along line II—II in FIG. 1.
Figure 3:
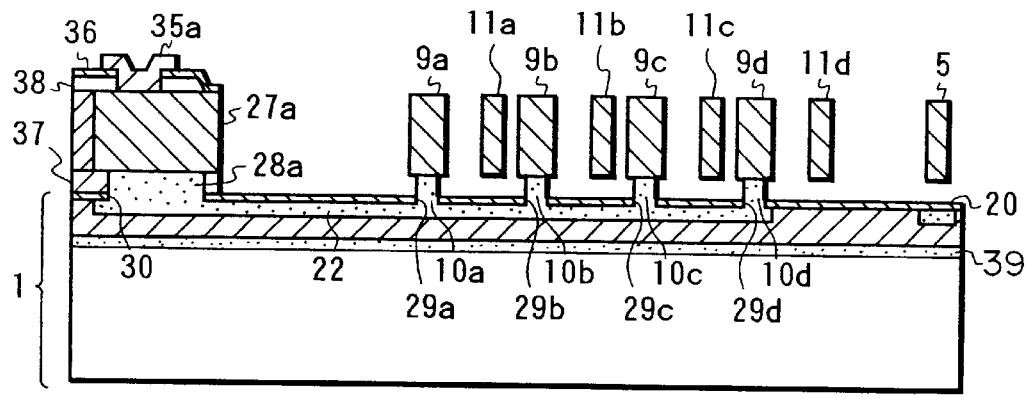
FIG. 3 is a sectional view taken along line III—III in FIG. 1.
Figure 4:
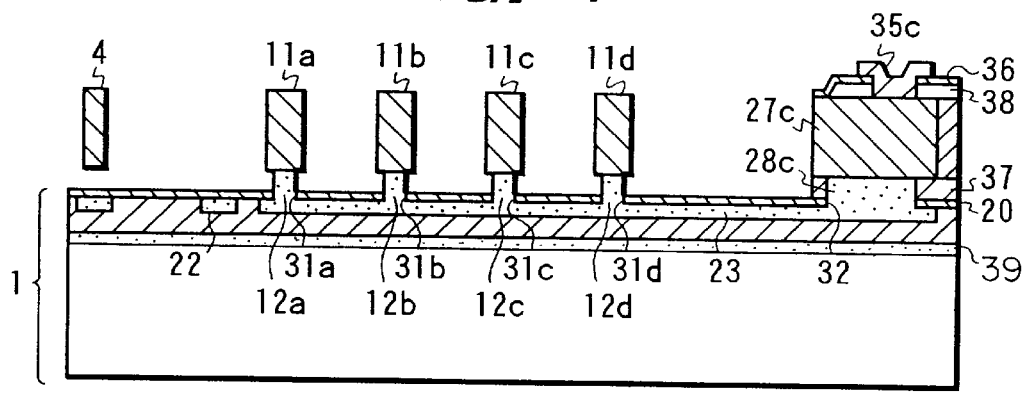
FIG. 4 is a sectional view taken along line IV—IV in FIG. 1.
Figure 5:
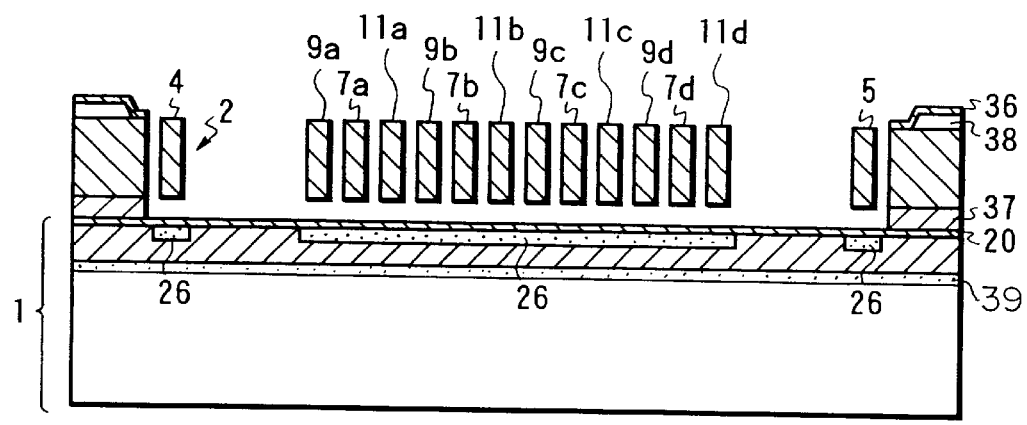
FIG. 5 is a sectional view taken along line V—V in FIG. 1.

FIG. 1 is a plan view of the acceleration sensor according to the first preferred embodiment, FIG. 2 is a sectional view taken along line II—II in FIG. 1, FIG. 3 is a sectional view taken along line III—III in FIG. 1, FIG. 4 is a sectional view taken along line IV—IV in FIG. 1, and FIG. 5 is a sectional view taken along line V—V in FIG. 1.

In FIGS. 1 and 2, a beam structure 2 is formed of monocrystalline silicon (monocrystalline semiconductor material) and disposed on a substrate 1. The beam structure 2 is suspended by four anchors 3a, 3b, 3c and 3d projected from the substrate 1 so as to be spaced by a given distance from the surface of the substrate 1. The anchors 3a–3d are formed of polysilicon films. A beam 4 is suspended between the anchors 3a and 3b, while a beam 5 is suspended between the anchors 3c and 3d. A rectangular mass 6 is further suspended between the beams 4 and 5. The mass 6 is formed with through holes 6a which facilitate invasion of an etchant upon sacrificial layer etching. Four movable electrodes 7a, 7b, 7c and 7d project from one side (left side in FIG. 1) of the mass 6. The movable electrodes 7a–7d are in the form of rods, respectively, and extend in parallel to each other at regular intervals therebetween. Similarly, four movable electrodes 8a, 8b, 8c and 8d project from the other side (right side in FIG. 1) of the mass 6. The movable electrodes 8a–8d are in the form of rods, respectively, and extend in parallel to each other at regular intervals therebetween. The beams 4 and 5, the mass 6 and the movable electrodes 7a–7d and 8a–8d are movable after partly removing a sacrificial oxide layer 37. The region to be etched is shown by the dotted line Z1 in FIG. 1.

As described above, the beam structure 2 has the two comb-shaped movable electrodes (7a–7d and 8a–8d).

On the substrate 1 are fixed four first fixed electrodes 9a, 9b, 9c and 9d which are made of monocrystalline silicon. The first fixed electrodes 9a–9d are supported by anchors 10a, 10b, 10c and 10d, respectively, which project from the substrate 1. Each of the first fixed electrodes 9a–9d faces one side of the corresponding movable electrode 7a–7d. Four second fixed electrodes 11a, 11b, 11c and 11d are further fixed on the substrate 1, which are also made of monocrystalline silicon. The second fixed electrodes 11a–11d are supported by anchors 12a, 12b, 12c and 12d, respectively, which project from the substrate 1. Each of the second fixed electrodes 11a–11d faces the other side of the corresponding movable electrode 7a–7d.

Similarly, on the substrate 1 are fixed first fixed electrodes 13a, 13b, 13c and 13d and second fixed electrodes 15a, 15b, 15c and 15d which are also made of monocrystalline silicon. The first fixed electrodes 13a–13d are supported by anchors 14a, 14b, 14c and 14d projecting from the substrate 1. Each of the fist fixed electrodes 13a–13d faces one side of the corresponding movable electrode 8a–8d. The second fixed electrodes 15a–15d are supported by anchors 16a, 16b, 16c and 16d projecting from the substrate 1. Each of the second fixed electrodes 15a–15d faces the other side of the corresponding movable electrode 8a–8d.

As shown in FIG. 2, the substrate 1 has a laminated structure, wherein a polysilicon film 39, a lower layer insulating film 18, conductive films 19 and an upper layer insulating film 20 are laminated on a silicon substrate (semiconductor substrate) 17 in the order named. In other words, a laminated structure 21 composed of the polysilicon film 39, the lower layer insulating film 18, the conductive films 19 and the upper layer insulating film 20 is disposed on the silicon substrate 17, wherein the conductive films 19 are buried between the insulating films 18 and 20. The lower layer insulating film 18 is made of silicon oxide, while the upper layer insulating film 20 is made of silicon nitride. The insulating films 18 and 20 are formed by the CVD method or the like. On the other hand, the conductive films 19 are made of polysilicon doped with impurities, such as P (phosphorus).

The conductive films 19 form four wiring patterns 22, 23, 24 and 25 and a lower electrode (electrostatic force preventing fixed electrode) 26. The wiring pattern 22 has an L shape and provides wiring for the first fixed electrodes 9a–9d. The wiring pattern 23 has an L shape and provides wiring for the second fixed electrodes 11a–11d. The wiring pattern 24 has an L shape and provides wiring for the first fixed electrodes 13a–13d. The wiring pattern 25 has an L shape and provides wiring for the second fixed electrodes 15a–15d. The lower electrode 26 is formed at a region of the substrate 1 facing the beam structure 2.

First capacitors are defined between the movable electrodes 7a–7d and the corresponding first fixed electrodes 9a–9d, respectively, and second capacitors are defined between the movable electrodes 7a–7d and the corresponding second fixed electrodes 11a–11d, respectively. Similarly, first capacitors are defined between the movable electrodes 8a–8d and the corresponding first fixed electrodes 13a–13d, respectively, and second capacitors are defined between the movable electrodes 8a–8d and the corresponding second fixed electrodes 15a–15d, respectively.

Electrode connecting portions 27a, 27b, 27c and 27d made of monocrystalline silicon are provided so as to be supported by anchors 28a, 28b, 28c and 28d, respectively, which project from the substrate 1.

As shown in FIG. 3, the upper layer insulating film 20 is formed with openings 29a, 29b, 29c, 29d and 30. The foregoing anchors (impurity doped polysilicon) 10a–10d are arranged in the openings 29a–29d, while the anchor (impurity doped polysilicon) 28a is arranged in the opening 30. Thus, the wiring pattern 22 and the first fixed electrodes 9a–9d are electrically connected to each other via the openings 29a–29d and the anchors (impurity doped polysilicon) 10a–10d, while the wiring pattern 22 and the electrode connecting portion 27a are electrically connected via the opening 30 and the anchor (impurity doped polysilicon) 28a.

As shown in FIG. 4, the upper layer insulating film 20 is formed with openings 31a, 31b, 31c, 31d and 32. The foregoing anchors (impurity doped polysilicon) 12a–12d are arranged in the openings 31a–31d, while the anchor (impurity doped polysilicon) 28c is arranged in the opening 32. Thus, the wiring pattern 23 and the second fixed electrodes 11a–11d are electrically connected to each other via the openings 31a–31d and the anchors (impurity doped polysilicon) 12a–12d, while the wiring pattern 23 and the electrode connecting portion 27c are electrically connected via the opening 32 and the anchor (impurity doped polysilicon) 28c.

Similarly, the wiring pattern 24 and the first fixed electrodes 13a–13d are electrically connected to each other via openings (not shown) of the upper layer insulating film 20 and the anchors 14a–14d, while the wiring pattern 24 and the electrode connecting portion 27b are electrically connected to each other via an opening (not shown) of the upper layer insulating film 20 and the anchor 28b.

Similarly, the wiring pattern 25 and the second fixed electrodes 15a–15d are electrically connected to each other via openings (not shown) of the upper layer insulating film 20 and the anchors 16a–16d, while the wiring pattern 25 and the electrode connecting portion 27d are electrically connected to each other via an opening (not shown) of the upper layer insulating film 20 and the anchor 28d.

As shown in FIG. 2, the upper layer insulating film 20 is further formed with openings 33 in which the foregoing anchors (impurity doped polysilicon) 3a–3d are arranged, respectively. Thus, the lower electrode 26 and the beam structure 2 are electrically connected to each other via the anchors 3a–3d.

Accordingly, the substrate 1 is so arranged that the wiring patterns 22–25 and the lower electrode 26 made of polysilicon are buried under the SOI layers. This structure is achieved using the surface micro-machining technique.

On the other hand, as shown in FIGS. 1 and 2, an electrode (bonding pad) 34 formed of an aluminum film is provided above the anchor 3a. Further, as shown in FIGS. 1, 3 and 4, aluminum-film electrodes (bonding pads) 35a, 35b, 35c and 35d are provided on the electrode connecting portions 27a–27d, respectively. On the electrode connecting portions 27a–27d, layer insulation films 38 and silicon nitride films 36 are further formed, respectively. These films 38 and 36 are formed at regions other than the foregoing region Z1 in FIG. 1.

Based on capacitances of the first capacitors formed between the movable electrodes 7a–7d and the first fixed electrodes 9a–9d (and capacitances of the first capacitors formed between the movable electrodes 8a–8d and the first fixed electrodes 13a–13d) and capacitances of the second capacitors formed between the movable electrodes 7a–7d and the second fixed electrodes 11a–11d (and capacitances of the second capacitors formed between the movable electrodes 8a–8d and the second fixed electrodes 15a–15d), acceleration applied to the beam structure 2 can be detected. Specifically, two differential capacitances are formed between each movable electrode and the corresponding fixed electrodes, and the servo control is performed so as to cause the two capacitances to be equal to each other.

Further, by setting the beam structure 2 and the lower electrode 26 to be equipotential to each other, electrostatic forces are prevented from being generated between the beam structure 2 and the substrate 1. Specifically, since the lower electrode 26 and the beam structure 2 are connected to each other via the anchors 3a–3d, they are equipotential to each other so that the beams 4 and 5 and the mass 6 with the movable electrodes are prevented from being attached onto the substrate 1 due to electrostatic forces. Otherwise, since the beam structure 2 is insulated relative to the silicon substrate 17, the beam structure 2 tends to be attached onto the substrate 1 even with a small difference in potential between the beam structure 2 and the silicon substrate 17.

By employing the wiring patterns 22–25 and the lower electrode 26 each of which is separated by the insulators, the aluminum electrodes (bonding pads) 34 and 35a–35d can be achieved through the surface of the substrate 1. This facilitates the production process of the acceleration sensor.

Now, an operation of the acceleration sensor thus structured for detecting acceleration will be briefly described with reference to FIG. 1.

When acceleration is zero, each of the movable electrodes 7a–7d (8a–8d) is located at the middle point between the corresponding fixed electrodes 9a–9d (13a–13d) and 11a–11d (15a–15d), and a capacitance C1 of the first capacitor formed by each movable electrode 7a–7d (8a–8d) and the corresponding fixed electrode 9a–9d (13a–13d) and a capacitance C2 of the second capacitor formed by each movable electrode 7a–7d (8a–8d) and the corresponding fixed electrode 11a–11d (15a–15d) are set equal to each other. Further, when acceleration is zero, a voltage V1 applied across each first capacitor and a voltage V2 applied across each second capacitor are also set equal to each other so that each movable electrode is attracted to opposite sides, that is, toward the corresponding fixed electrodes 9a–9d (13a–13d) and 11a–11d (15a–15d), with electrostatic forces F1 and F2 of the same magnitude, respectively. On the other hand, if acceleration is applied in a direction parallel to the surface of the substrate 1 so as to displace the movable electrodes relative to the fixed electrodes, the capacitances C1 and C2 are caused to have different values so that the electrostatic forces F1 and F2 become unequal to each other. Then, the magnitudes of V1 and V2 are so controlled as to cause the electrostatic forces F1 and F2 to have values which displace each movable electrode to the middle point between the corresponding fixed electrodes to render C1 and C2 equal to each other. When C1 and C2 are rendered equal to each other, the applied acceleration and the applied electrostatic forces are balanced so that the magnitude of acceleration can be derived based on the controlled magnitudes of V1 and V2.

As described above, by controlling the magnitudes of voltages applied to the fixed electrodes forming the first and second capacitors so as not to displace the movable electrodes against the applied acceleration, the magnitude of acceleration can be detected based on variation of the applied voltages.

Now, fabrication of the acceleration sensor shown in FIG. 1 will be described hereinbelow with reference to FIGS. 6–16. FIGS. 6–16 are schematic sectional views showing fabrication steps of the acceleration sensor on an A—A section in FIG. 1.

Figure 6:
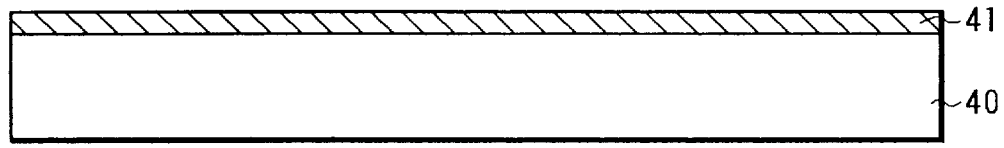
FIGS. 6–16 are diagrams for explaining a fabrication process of the acceleration sensor shown in FIG. 1.
Figure 7:
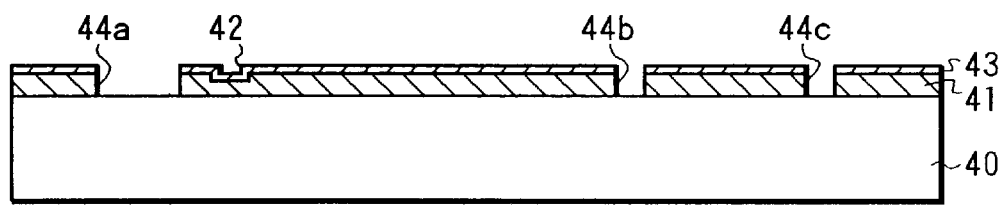

First, as shown in FIG. 6, a monocrystalline silicon substrate 40 as a first semiconductor substrate is provided, and then a silicon oxide film 41 as a sacrificial layer is formed on the silicon substrate 40 through thermal oxidation, CVD or the like. Subsequently, as shown in FIG. 7, the silicon oxide film 41 is partly removed to form a concave portion 42 through photolithography and etching. Further, for increasing the surface roughness and using as an etching stopper upon sacrificial layer etching, a silicon nitride film (first insulating film) 43 is formed. Then, a laminated structure of the silicon oxide film 41 and the silicon nitride film 43 is subjected to photolithography and dry etching so as to form openings 44a, 44b and 44c at regions where anchors will be formed. These openings 44a–44c are used for connecting a beam structure and a substrate (lower electrode) and connecting fixed electrodes and a wiring pattern.

Figure 8:
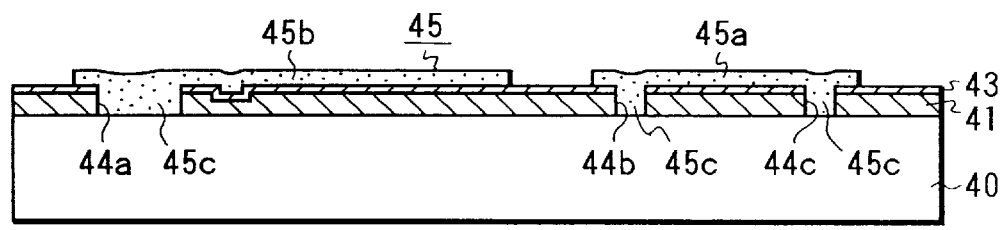
Figure 9:
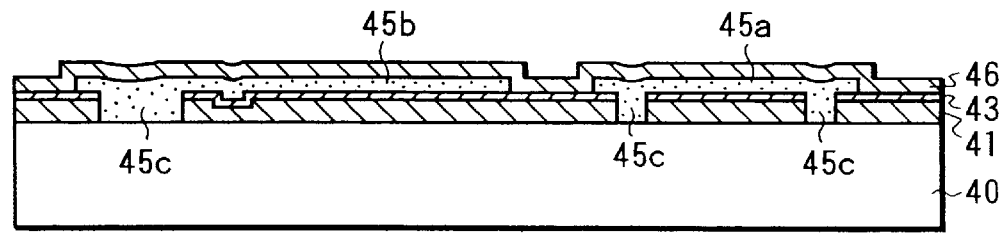

Subsequently, as shown in FIG. 8, a polysilicon film 45 as a conductive film is formed on the silicon nitride film 43 including the openings 44a–44c, and then introduced with impurities through P (phosphorus) diffusion. Thereafter, through photolithography, a wiring pattern 45a, a lower electrode 45b and anchors 45c are formed at given regions on the silicon nitride film 43. Further, as shown in FIG. 9, a silicon oxide film 46 as a second insulating film is formed through CVD on the silicon nitride film 43 including the polysilicon films 45.

Figure 10:
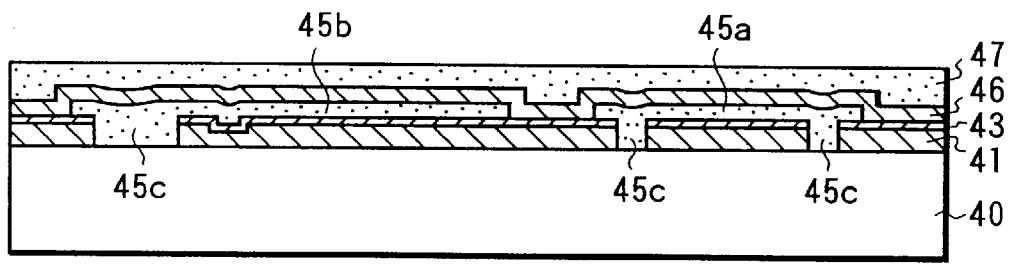

Further, as shown in FIG. 10, a polysilicon film 47 as an attaching film is formed on the silicon oxide film 46, and then flattened through mechanical polishing.

Figure 11:
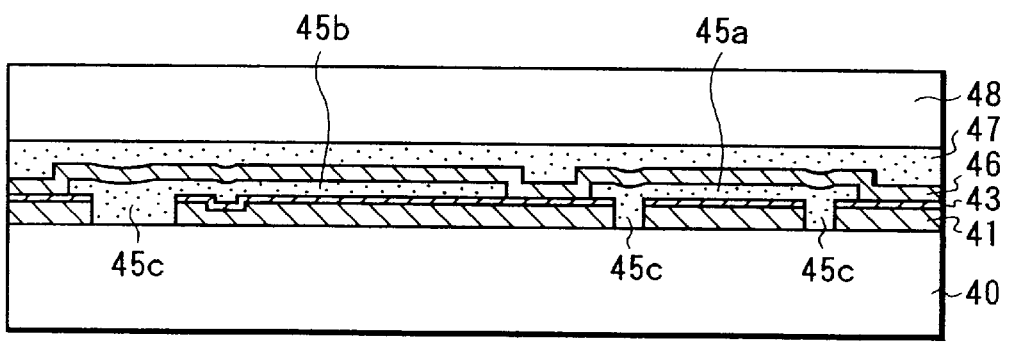

Then, as shown in FIG. 11, a monocrystalline silicon substrate (support substrate) 48 is provided as a second semiconductor substrate and attached to the flattened surface of the polysilicon film 47.

Figure 12:
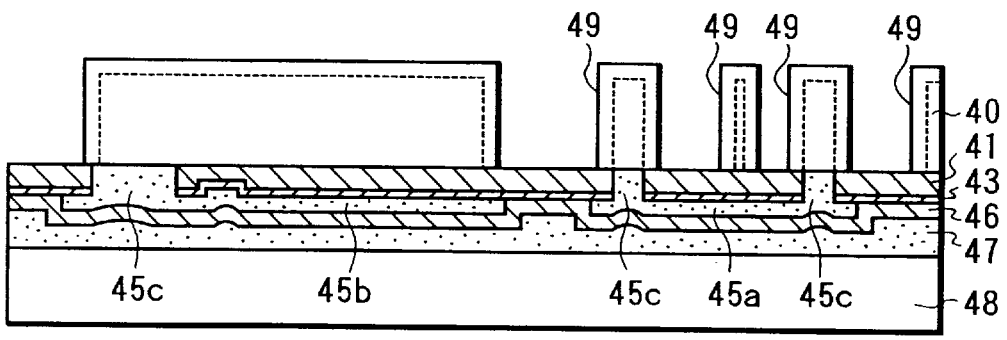

Further, as shown in FIG. 12, the laminated structure shown in FIG. 11 is turned upside down, and then the silicon substrate 40 is mechanically polished to a given thickness (for example, 1 $\mu$m–2 $\mu$m). Thereafter, through photolithography and trench etching, the silicon substrate 40 is formed with grooves of constant widths, and then groove patterns 49 are formed for providing the beam structure. In this manner, the unnecessary regions 49 of the silicon substrate 40 are removed to form the silicon substrate 40 into a given shape. Further, impurities are introduced into the silicon substrate 40 through P (phosphorus) diffusion for providing electrodes for detecting capacitances.

In the step where the unnecessary regions of the silicon substrate 40 are removed to form the silicon substrate 40 into the given shape, since the silicon substrate 40 is thin (for example, 1 $\mu$m–2 $\mu$m) enough to satisfy the lower pattern resolution of a stepper, the shapes of the openings 44a–44c (see FIG. 7) of the silicon oxide film 41 can be seen through the silicon substrate 40 so that photomask matching can be performed with accuracy.

Figure 13:
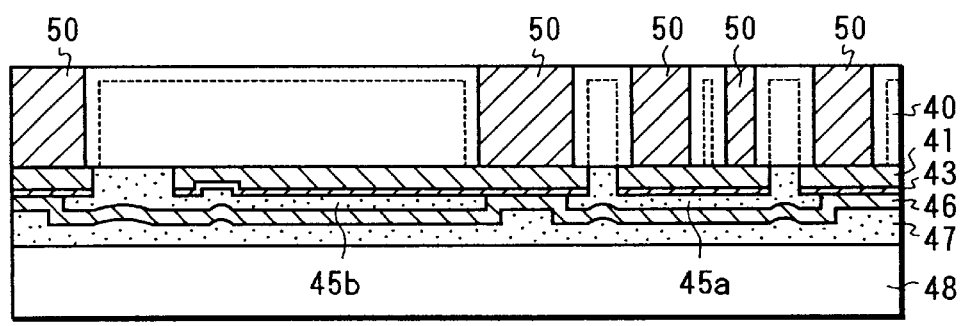

Then, as shown in FIG. 13, a silicon oxide film 50 is formed through CVD, and then the etch back is performed by dry etching so as to flatten the surface.

Figure 14:
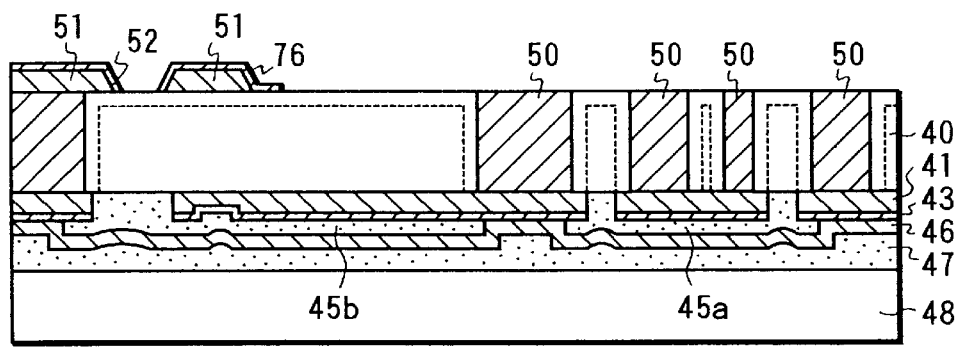

Further, as shown in FIG. 14, layer insulation films 51 are formed and, through photolithography and dry etching, a contact hole 52 is formed. Then, silicon nitride films 76 are formed at given regions on the layer insulation films 51.

Figure 15:
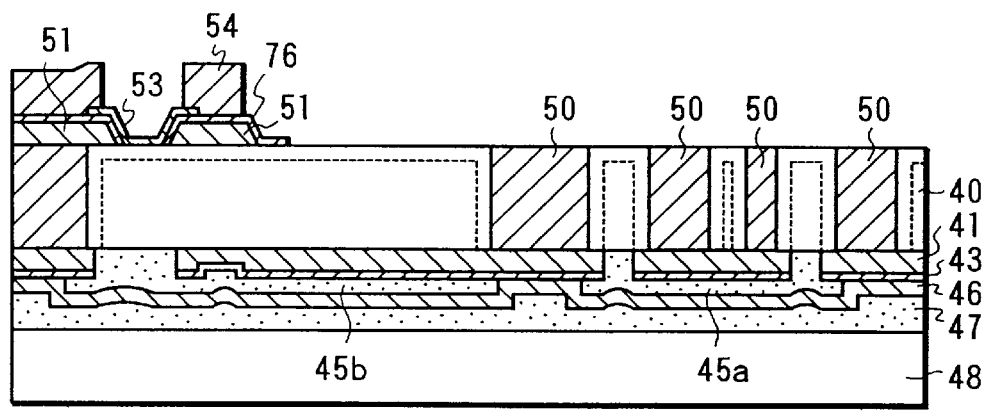

Further, as shown in FIG. 15, an aluminum electrode 53 is formed through photolithography, and then passivation films 54 are formed through photolithography.

Figure 16:
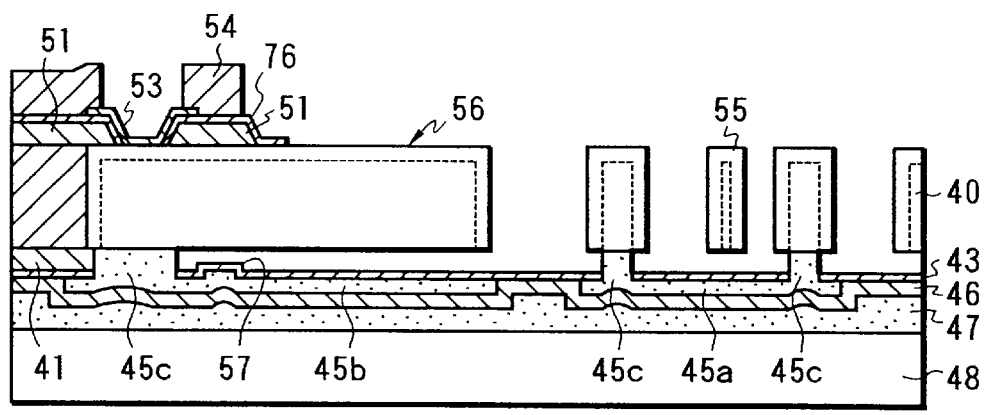

Finally, as shown in FIG. 16, the silicon oxide films 41 and 50 are removed through etching using an HF etchant so as to cause a beam structure 56 having movable electrodes 55 to be movable. Specifically, given portions of the silicon oxide film 41 are removed through sacrificial layer etching using the etchant so as to render the silicon substrate 40 movable. In this case, a sublimation agent, such as paradichlorobenzene, is used for preventing the movable portions from being fixed onto the substrate during drying process after etching.

In the step where the given portions of the silicon oxide film 41 are removed through sacrificial layer etching using the etchant so as to render the silicon substrate 40 movable, since the anchors 45c are made of polysilicon, etching is stopped at the anchors 45c. Specifically, in this embodiment, the sacrificial layer is made of silicon oxide, the conductive films are made of polysilicon, and the HF etchant is used. Since silicon oxide is dissolved by the HF etchant while polysilicon is not dissolved by the HF etchant, it is not necessary to accurately control the concentration and the temperature of the HF etchant or the termination of etching so that the production process can be facilitated.

Figure 42:
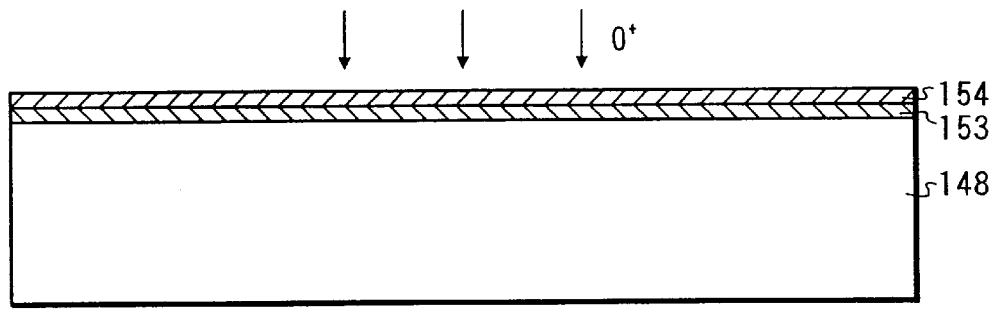
FIGS. 42–46 are diagrams for explaining a fabrication process of the acceleration sensor shown in FIG. 39.
Figure 43:
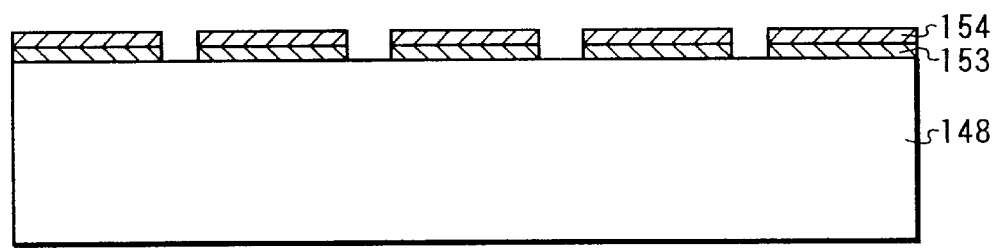
Figure 44:
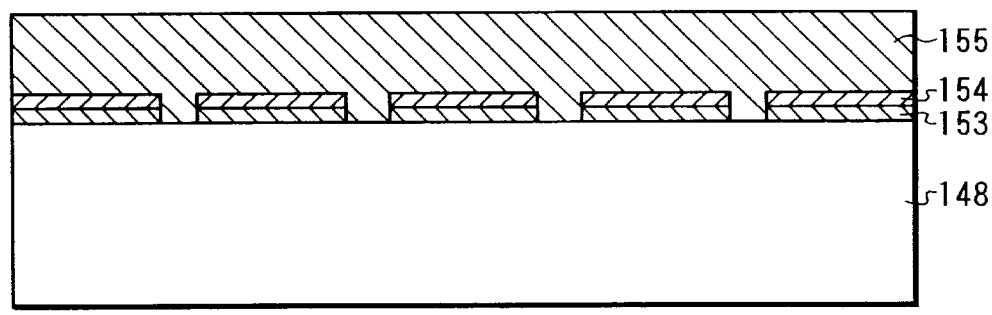
Figure 45:
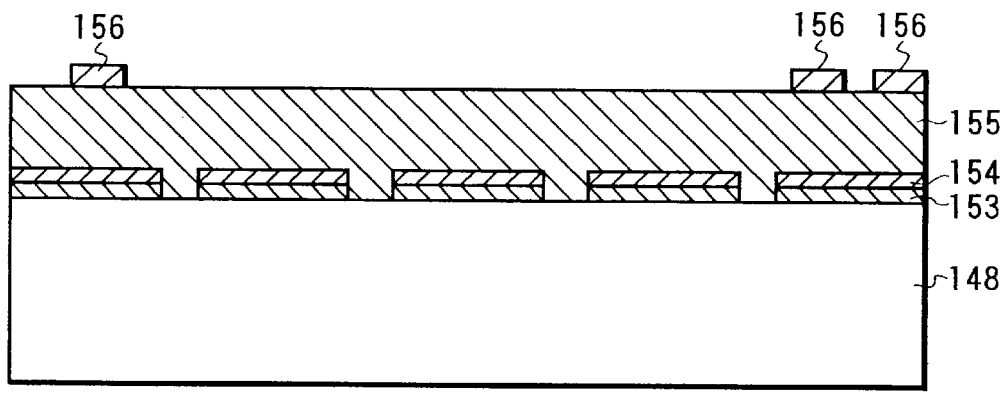
Figure 46:
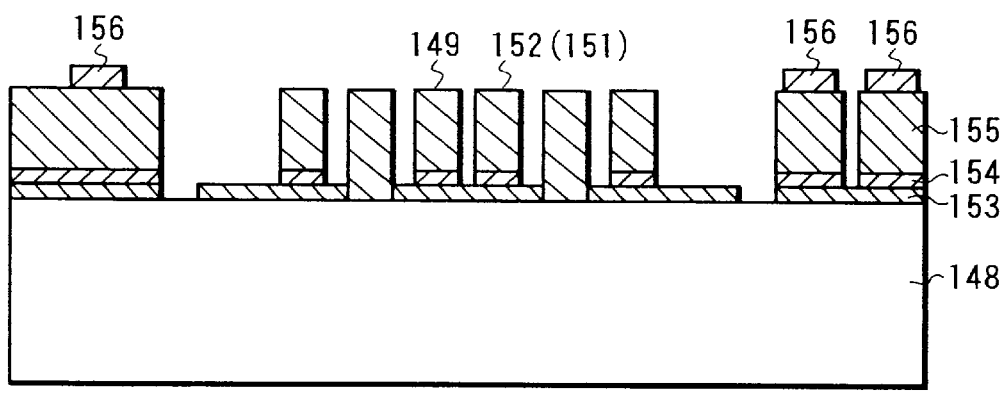
Figure 47:
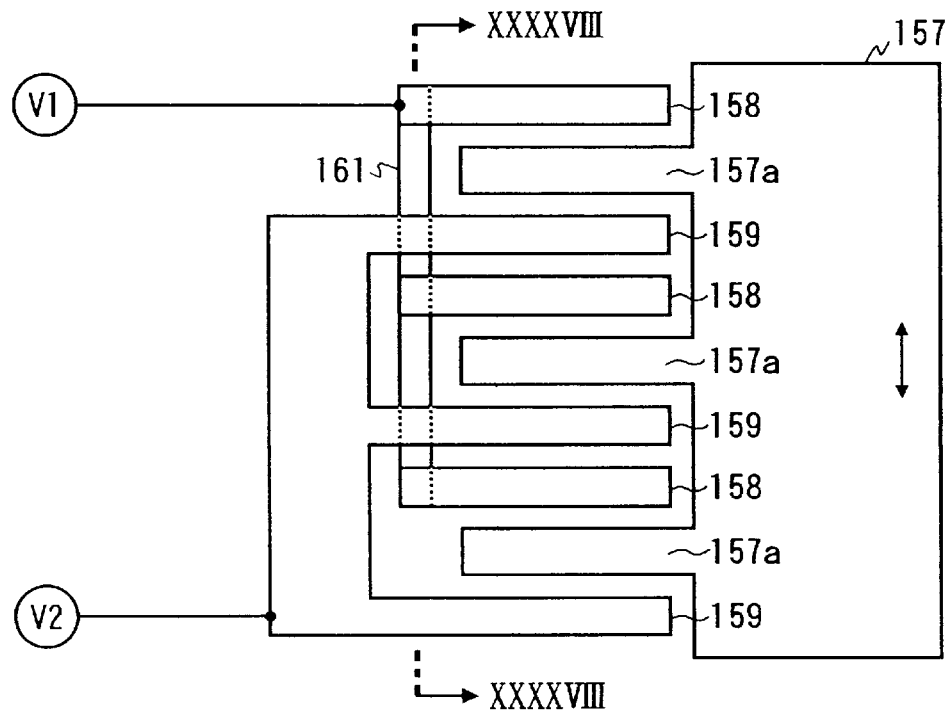
FIG. 47 is a plan view showing another conventional acceleration sensor.

Specifically, when using the SOI substrate shown in FIG. 42, the length of the beam changes depending on an etching time upon sacrificial layer etching. On the other hand, in this embodiment, etching is finished irrespective of an etching time when etching reaches the anchor so that the length of the beam always becomes constant. Thus, the spring constant of the acceleration sensor can be accurately controlled.

Further, a projection 57 is formed as shown in FIG. 16 corresponding to the concave portion 42 shown in FIG. 7. Accordingly, in an etchant replacing step after sacrificial layer etching, although droplets of a rinse liquid (replacing liquid), such as DI (de-ionized) water, remain between a liquid movable portion and the substrate, adhering areas of the droplets can be reduced to decrease the surface tension so that a movable portion is prevented from being fixed onto the substrate upon vaporization of the rinse liquid.

As described above, the servo-control acceleration sensor can be formed using the buried SOI substrate and forming the wiring pattern 45a and the lower electrode 45b each of which is separated by the insulators.

Figure 48:
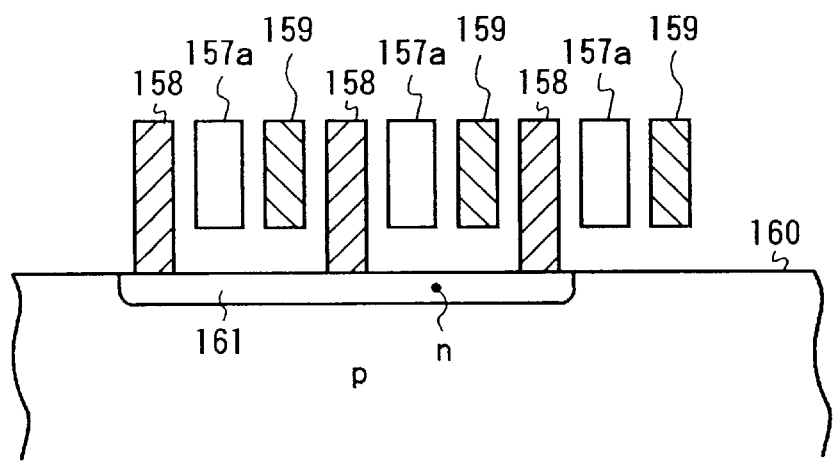
FIG. 48 is a sectional view taken along line XXXXVIII—XXXXVIII in FIG. 47.

According to this embodiment, the following advantages (1)–(6) can be achieved:

(1) The beam structure 2 is arranged on the substrate 1 spacing the given distance therefrom and applied with acceleration (physical quantity) so as to be displaced. The fixed electrodes 9a–9d, 11a–11d, 13a–13d and 15a–15d are fixed on the substrate 1 so as to face the movable electrodes 7a–7d and 8a–8d, respectively, which form portions of the beam structure 2. At the upper portion of the substrate 1, the laminated structure 21 of the lower layer insulating film 18, the conductive films 19 and the upper layer insulating film 20 as shown in FIG. 2 is disposed. The conductive films 19 form the wiring patterns 22–25 and the lower electrode 26. Through the openings 29a–29d, 31a–31d, 30, 32 and 33 formed in the upper layer insulating film 20, the wiring patterns 22–25 and the lower electrode 26 are electrically connected to the fixed electrodes 9a–9d, 11a–11d, 13a–13d and 15a–15d, the beam structure 2, the electrode connecting portions 27a–27d (electrical connecting members). In this manner, the SOI substrate (buried SOI substrate) is employed, wherein the insulating films are disposed at the upper portion of the substrate 1 and the films (polysilicon) are buried between the insulating films as the wiring patterns and the electrode. With this arrangement, the wiring patterns and the electrode which are separated by the insulators can be formed. As compared with using the impurity diffusion layer 161 (pn junction separation) shown in FIG. 48, reduction in junction leak can be achieved. Particularly, reduction in junction leak at high temperatures can be achieved.

(2) The laminated structure 21 of the lower layer insulating film 18, the conductive films 19 and the upper layer insulating film 20 is disposed at the upper portion of the substrate 1. The conductive films 19 form the wiring patterns 22 and 24 for the first fixed electrodes and the wiring patterns 23 and 25 for the second fixed electrodes. Via the openings 29a–29d and 31a–31d and the anchors of the fixed electrodes, the wiring patterns 22–25 and the fixed electrodes 9a–9d, 11a–11d, 13a–13d and 15a–15d are electrically connected. In this manner, the first fixed electrode energization lines and the second fixed electrode energization lines can be crossed, respectively, using the wiring patterns 22–25 buried between the insulating films which are disposed at the upper portion of the substrate 1.

Employing the SOI substrate (buried SOI substrate) where the buried films (polysilicon) are used as the wiring patterns of the substrate side, the wiring patterns (conductive films) separated by the insulators can be formed. Accordingly, as compared with using the impurity diffusion layer 161 (pn junction separation) shown in FIG. 48, reduction in junction leak can be achieved. Particularly, reduction in junction leak at high temperatures can be achieved.

(3) The laminated structure 21 of the lower layer insulating film 18, the conductive films 19 and the upper layer insulating film 20 is disposed at the upper portion of the substrate 1. The conductive films 19 form the wiring patterns 22 and 24 for the first fixed electrodes, the wiring patterns 23 and 25 for the second fixed electrodes and the lower electrode (electrostatic force preventing fixed electrode) 26. Via the openings 29a–29d and 31a–31d formed in the upper layer insulating film 20 and the anchors of the fixed electrodes, the wiring patterns 22–25 and the fixed electrodes 9a–9d, 11a–11d, 13a–13d and 15a–15d are electrically connected. Further, via the openings 33 formed in the upper layer insulating film 20 and the anchors 3a–3d of the beam structure 2, the lower electrode 26 and the beam structure are electrically connected. In this manner, the first fixed electrode energization lines and the second fixed electrode energization lines can be crossed, respectively, using the wiring patterns 22–25 buried between the insulating films which are disposed at the upper portion of the substrate 1. Further, by burying the lower electrode 26 between the insulating films, the beam structure (movable portion) and the lower electrode can be set to be equipotential to each other so as to prevent generation of electrostatic forces between the beam structure and the substrate. Thus, the beam structure is prevented from being attached onto the substrate, which would be otherwise caused due to even a small difference in potential between the beam structure and the substrate.

(4) Since monocrystalline silicon, which is a brittle material and whose materiality values, such as Young's modulus, are known, is used for the beam structure 2, reliability of the beam structure can be enhanced.

(5) By using polysilicon for the conductive films 19 and separating them by the insulating films, the influence of leakage current at high temperatures can be reduced as compared with the pn junction separation.

(6) Since the servo mechanism (servo control) is employed, the displacement of the beam structure due to acceleration can be minimized so that reliability of the sensor can be enhanced.

In the foregoing first preferred embodiment, the first fixed electrode wiring patterns 22 and 24 and the second fixed electrode wiring patterns 23 and 25 are formed by the conductive films 19. However, only the first or second fixed electrode wiring patterns may be formed by the conductive films 19, and the others may be in the form of aluminum wiring or comb-shaped electrodes. Further, in the foregoing first preferred embodiment, the wiring patterns for the fixed electrodes and the lower electrode are formed by the buried conductive films. However, the present invention is also applicable to a sensor having no lower electrode.

(Second Embodiment)

Now, the second preferred embodiment will be described hereinbelow with reference to FIGS. 17–27. FIGS. 17–27 are schematic sectional views, corresponding to FIGS. 6–16, showing fabrication steps of a servo-control differential capacitive semiconductor acceleration sensor according to the second preferred embodiment.

Figure 17:
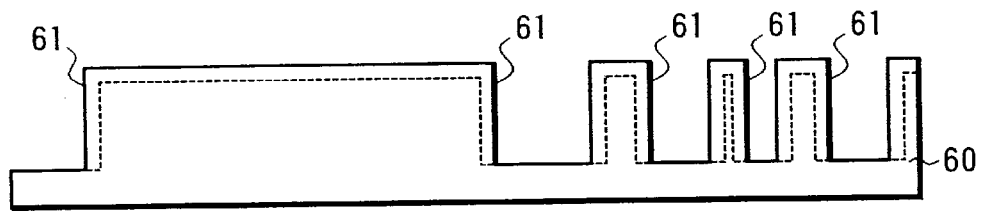
FIGS. 17–27 are diagrams for explaining a fabrication process of an acceleration sensor according to a second preferred embodiment of the present invention.
Figure 18:
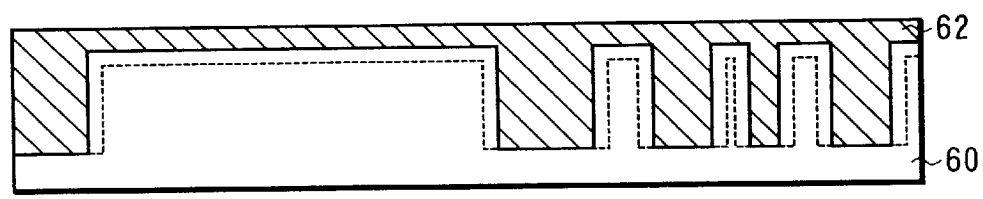

First, as shown in FIG. 17, a monocrystalline silicon substrate 60 is provided as a first semiconductor substrate. Then, the silicon substrate 60 is formed with grooves of constant widths through trench etching, and subsequently, groove patterns 61 are formed for providing a beam structure. Specifically, the grooves 61 are formed at given regions in the silicon substrate 60. Then, impurities are introduced into the silicon substrate 60 through P (phosphorus) diffusion so as to provide electrodes for detecting capacitances later. Thereafter, as shown in FIG. 18, a silicon oxide film 62 as a sacrificial layer is formed through CVD on the silicon substrate 60 including the grooves 61. Further, the surface of the silicon oxide film 62 is flattened.

Figure 19:
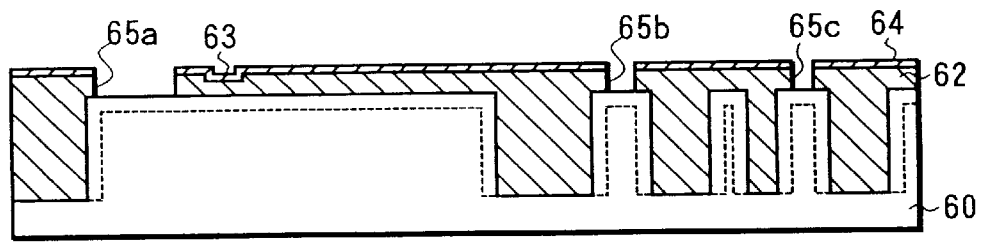

Then, as shown in FIG. 19, the silicon oxide film 62 is partly removed to form a concave portion 63 through photolithography and etching. The concave portion 63 is provided for decreasing the surface tension so as to prevent the beam structure from being attaching onto the substrate as described before with reference to the projection 57 shown in FIG. 16. Further, for increasing the surface roughness and using as an etching stopper upon sacrificial layer etching, a silicon nitride film (first insulating film) 64 is formed. Then, a laminated structure of the silicon nitride film 64 and the silicon oxide film 62 is subjected to photolithography and dry etching so as to form openings 65a, 65b and 65c at regions where anchors will be formed. These openings 65a–65c are used for connecting a beam structure and a substrate (lower electrode) and connecting fixed electrodes and a wiring pattern.

Figure 20:
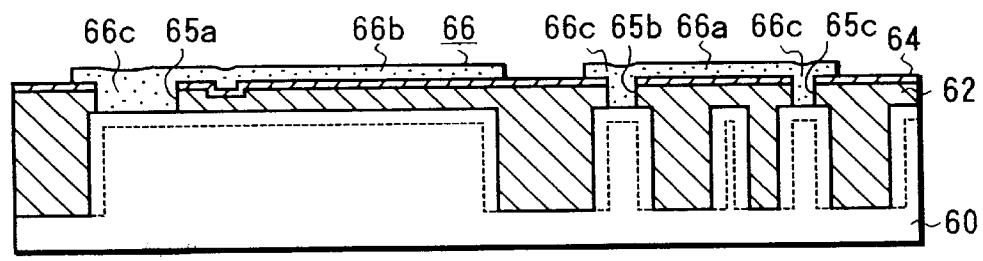

Subsequently, as shown in FIG. 20, a polysilicon film 66 is formed on the silicon nitride film 64 including the openings 65a–65c, and then introduced with impurities through P (phosphorus) diffusion. Thereafter, through photolithography, a wiring pattern 66a, a lower electrode 66b and anchors 66c are formed. In this manner, the impurity doped polysilicon films 66 as conductive films are formed at given regions on the silicon nitride film 64 including the openings 65a–65c. A thickness of the polysilicon films 66 is about 1 $\mu$m–2 $\mu$m.

In the step where the impurity doped polysilicon films 66 are formed at the given regions on the silicon nitride film 64 including the openings, since the polysilicon films 60 are thin (1$\mu$m–2$\mu$m) enough to satisfy the lower pattern resolution of a stepper, the shapes of the openings 65a–65c of the silicon nitride film 64 can be seen through the polysilicon films 66 so that photomask matching can be performed with accuracy.

Figure 21:
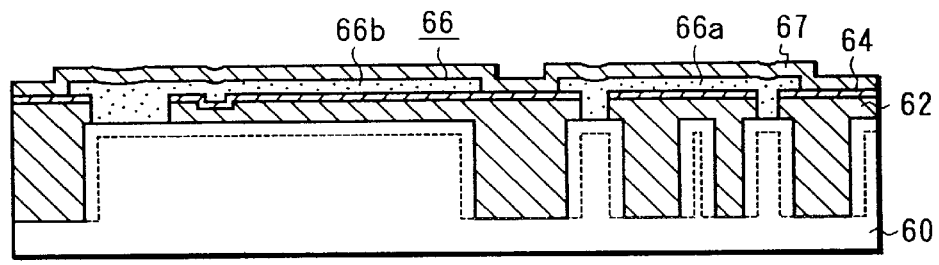

Then, as shown in FIG. 21, a silicon oxide film 67 as a second insulating film is formed on the silicon nitride film 64 including the polysilicon films 66.

Figure 22:
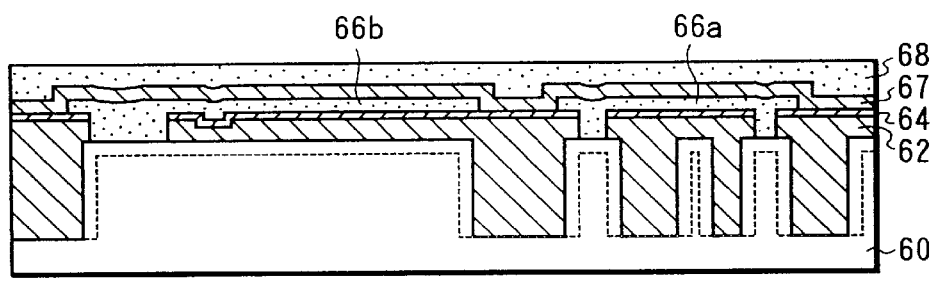

Further, as shown in FIG. 22, a polysilicon film 68 as an attaching film is formed on the silicon oxide film 67, and then flattened through mechanical polishing.

Figure 23:
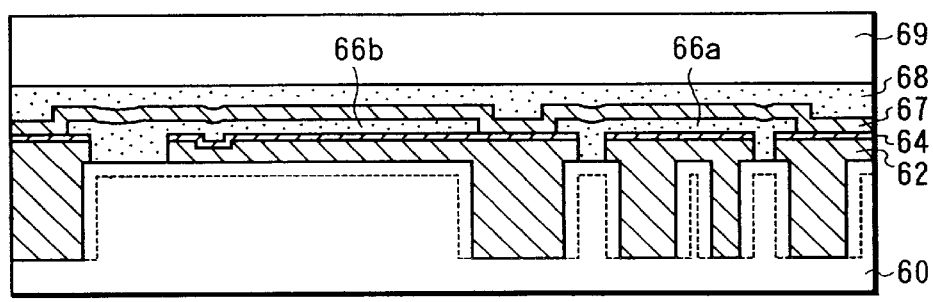

Then, as shown in FIG. 23, a monocrystalline silicon substrate (support substrate) 69 is provided as a second semiconductor substrate and attached to the flattened surface of the polysilicon film 68.

Figure 24:
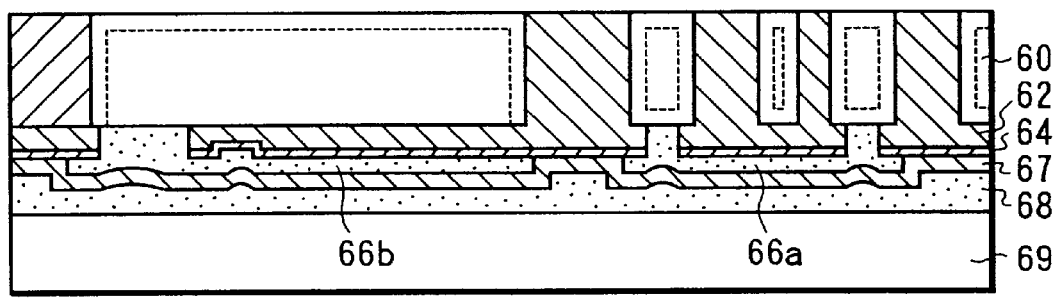

Further, as shown in FIG. 24, the laminated structure shown in FIG. 23 is turned upside down, and then the silicon substrate 60 is mechanically polished to a given thickness. In this case, if the polishing advances to a depth of the grooves formed by trench etching as shown in FIG. 17, the silicon oxide film 62 appears to change the hardness in polishing so that the termination of polishing can be easily detected.

Figure 25:
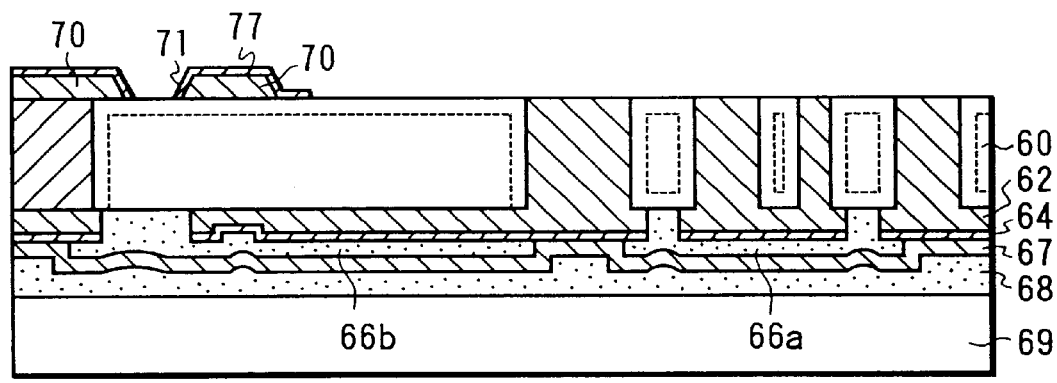

Subsequently, as shown in FIG. 25, layer insulation films 70 are formed and, through photolithography and dry etching, a contact hole 71 is formed. Then, silicon nitride films 77 are formed at given regions on the layer insulation films 70.

Figure 26:
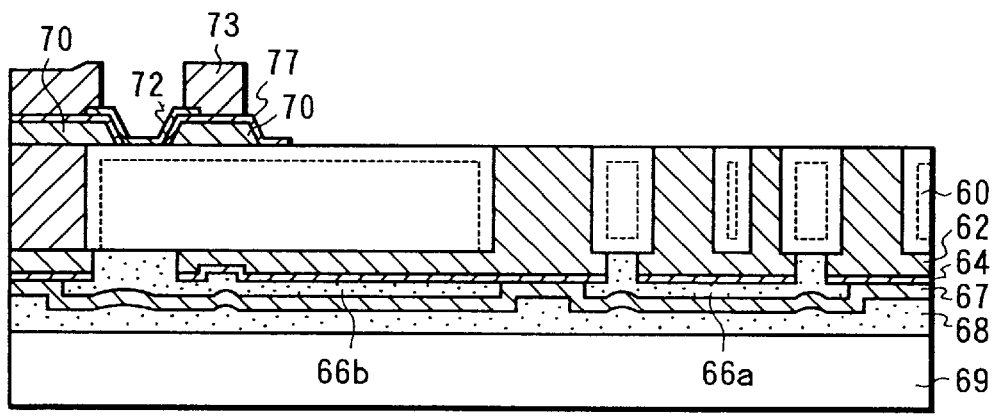

Further, as shown in FIG. 26, an aluminum electrode 72 is formed through photolithography, and then passivation films 73 are formed through photolithography.

Figure 27:
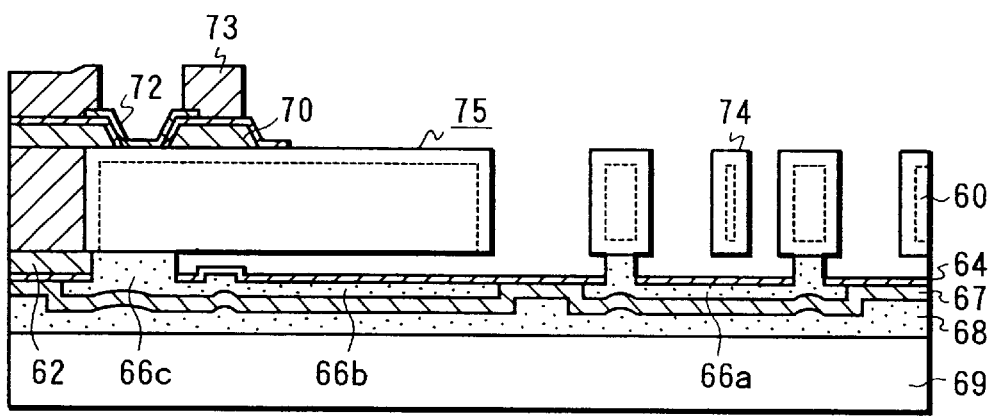

Finally, as shown in FIG. 27, the silicon oxide film 62 is removed through etching using an HF etchant so as to cause a beam structure 75 having movable electrodes 74 to be movable. Specifically, given portions of the silicon oxide film 62 are removed through sacrificial layer etching using the etchant so as to render the silicon substrate 60 movable. In this case, a sublimation agent, such as para-dichlorobenzene, is used for preventing the movable portions from being fixed onto the substrate during drying process after etching.

In the step where the given portions of the silicon oxide film 62 are removed through sacrificial layer etching using the etchant so as to render the silicon substrate 60 movable, since the anchors 66c are made of polysilicon, etching is stopped at the anchors 66c. Specifically, in this embodiment, the sacrificial layer is made of silicon oxide, the conductive films are made of polysilicon, and the HF etchant is used. Since silicon oxide is dissolved by the HF etchant while polysilicon is not dissolved by the HF etchant, it is not necessary to accurately control the concentration and the temperature of the HF etchant or the termination of etching so that the production process can be facilitated.

Specifically, when using the SOI substrate shown in FIG. 42, the length of the beam changes depending on an etching time upon sacrificial layer etching. On the other hand, in this embodiment, etching is finished irrespective of an etching time when etching reaches the anchor so that the length of the beam always becomes constant. Thus, the spring constant of the acceleration sensor can be accurately controlled.

As described above, the servo-control acceleration sensor can be formed using the buried SOI substrate and forming the wiring pattern and the lower electrode each of which is separated by the insulators.

(Third Embodiment)

Now, the third preferred embodiment will be described hereinbelow mainly with respect to differences over the foregoing first preferred embodiment.

Figure 28:
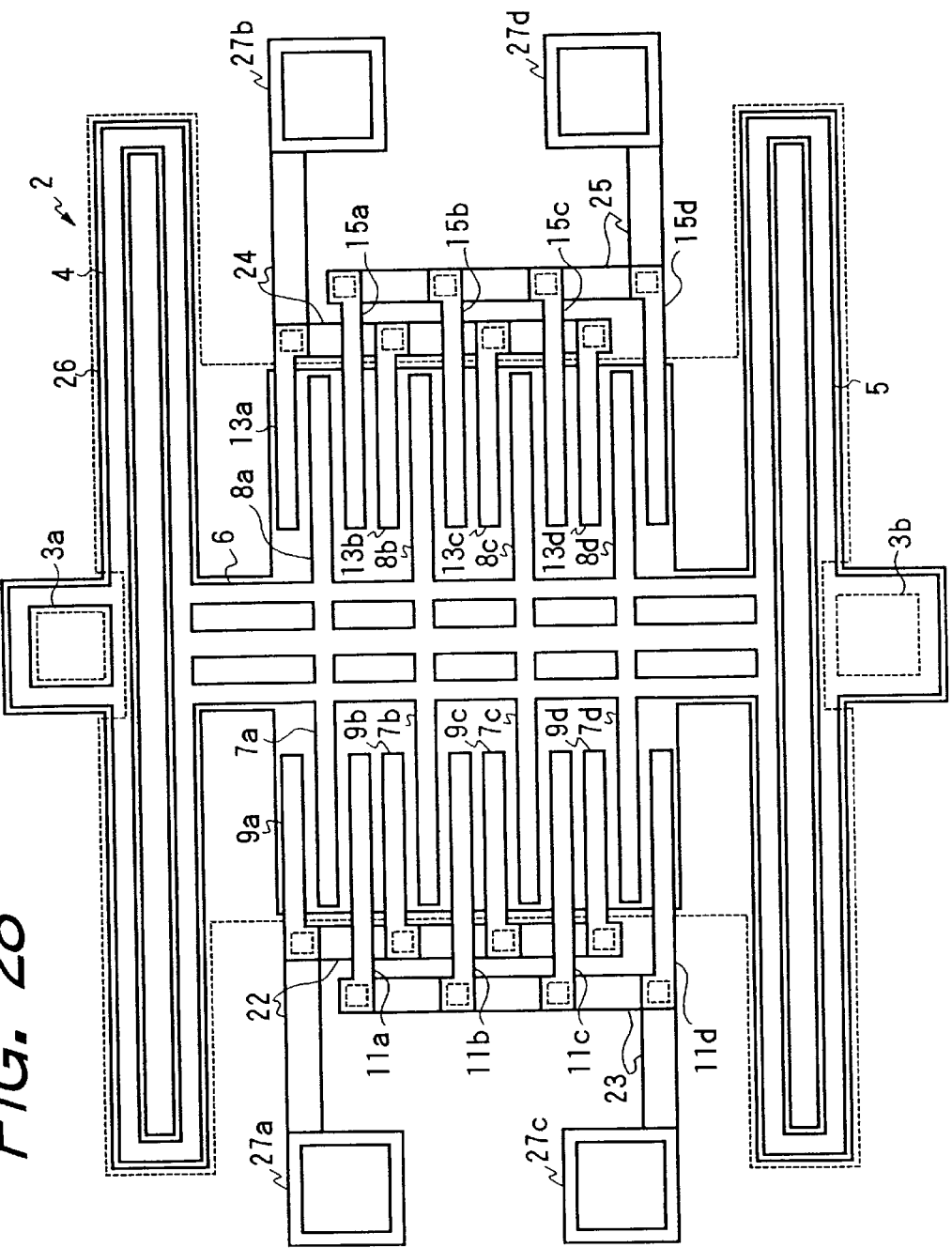
FIG. 28 is a plan view showing an acceleration sensor according to a third preferred embodiment of the present invention.

FIG. 28 is a plan view of a servo-control differential capacitive semiconductor acceleration sensor according to the third preferred embodiment. In FIG. 1, the mass 6 is supported by the beams 4 and 5 each of which extends linearly between the corresponding two anchors. On the other hand, in this embodiment, the beam 4 is supported only by the anchor 3a provided at the middle point of the beam 4, and the beam 5 is supported only by the anchor 3b provided at the middle point of the beam 5.

With this arrangement, even if the compressive stress remains in the film forming the beam structure 2, the beams are prevented from being bent due to the remaining compressive stress. Further, even if the tensile stress remains in the film forming the beam structure 2, the spring constant is prevented from deviating from a designed value.

(Fourth Embodiment)

Now, the fourth preferred embodiment will be described hereinbelow with reference to FIGS. 29 to 33.

In this embodiment, the present invention is applied to an exciting type yaw rate sensor, wherein two beam structures (movable structures) are provided and excited in opposite phases to each other so as to perform a differential detection.

Figure 29:
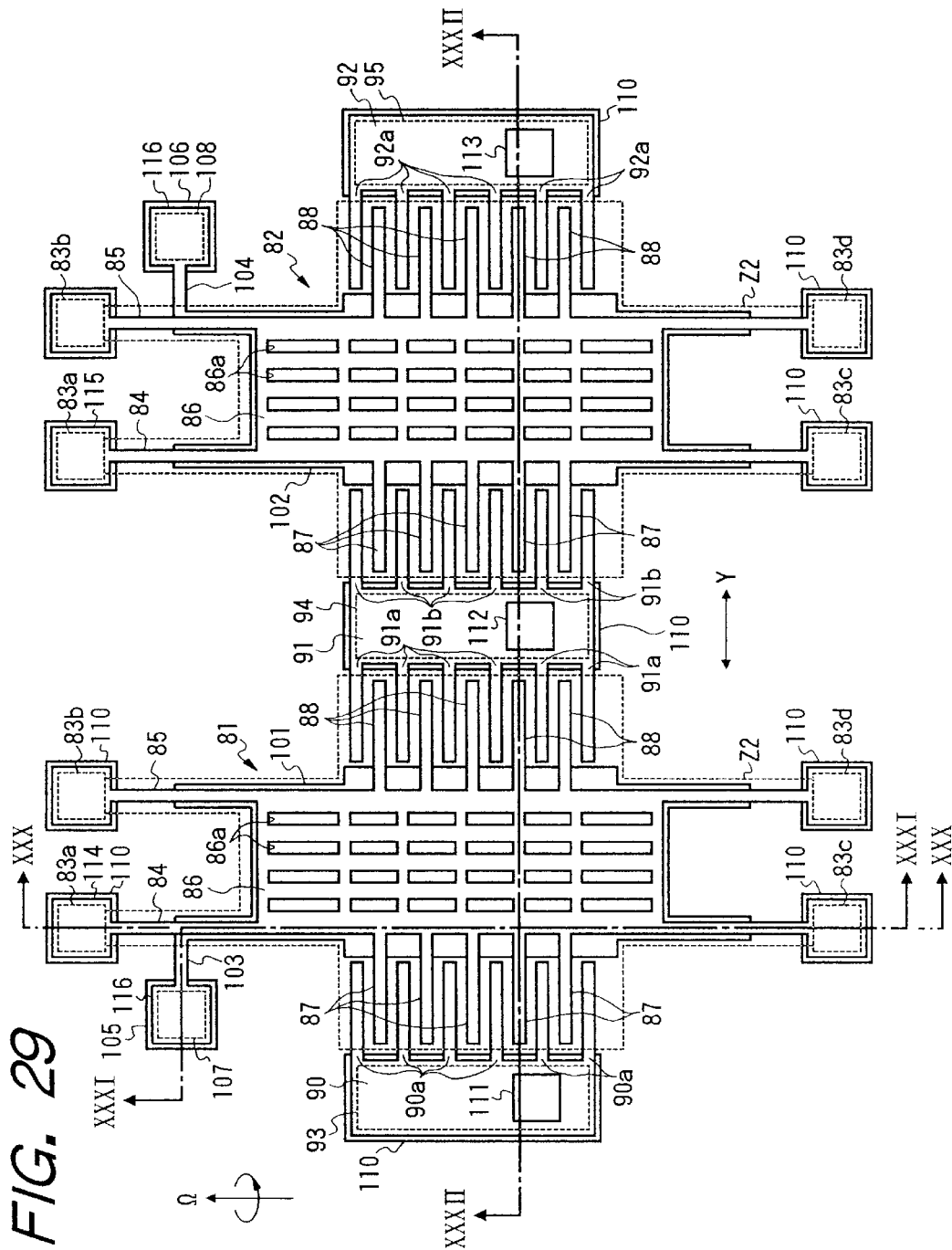
FIG. 29 is a plan view showing a yaw rate sensor according to a fourth preferred embodiment of the present invention.
Figure 30:
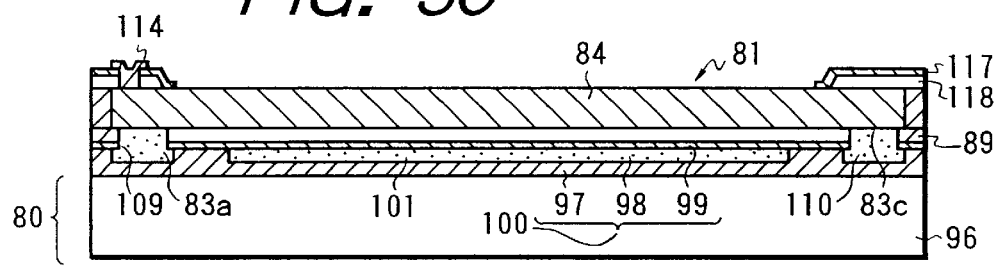
FIG. 30 is a sectional view taken along line XXX—XXX in FIG. 29.
Figure 31:
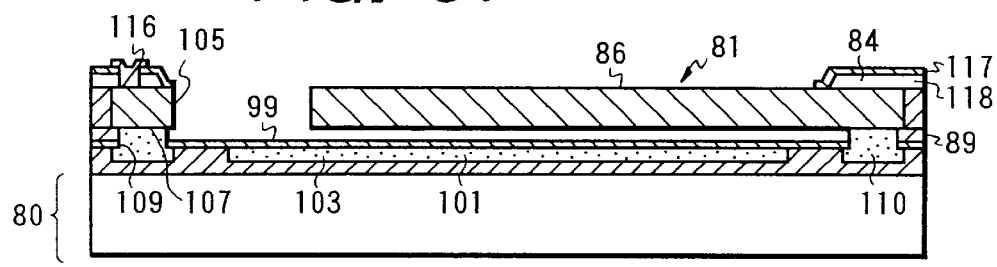
FIG. 31 is a sectional view taken along line XXXI—XXXI in FIG. 29.
Figure 32:
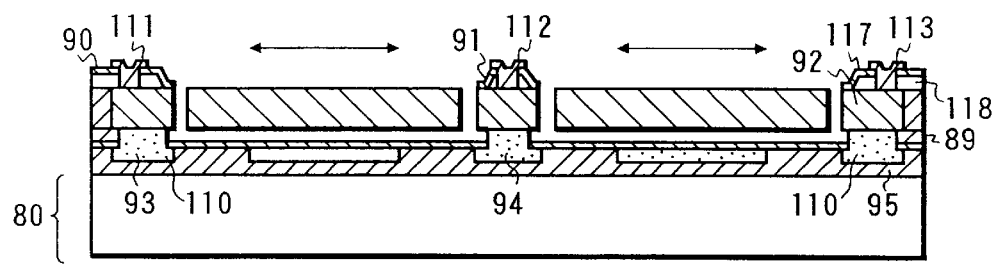
FIG. 32 is a sectional view taken along line XXXII—XXXII in FIG. 29.

FIG. 29 is a plan view of a yaw rate sensor according to the fourth preferred embodiment, FIG. 30 is a sectional view taken along line XXX—XXX in FIG. 29, FIG. 31 is a sectional view taken along line XXXI—XXXI in FIG. 29, and FIG. 32 is a sectional view taken along line XXXII—XXXII in FIG. 29.

In FIG. 30, a beam structure 81 and a beam structure 82 (see FIG. 29) are arranged on a substrate 80 adjacent to each other. The beam structures 81 and 82 are each formed of monocrystalline silicon (monocrystalline semiconductor material). The beam structure 81 is suspended by four anchors 83a, 83b, 83c and 83d projecting from the substrate 80, spacing a given distance from the surface of the substrate 80. The anchors 83a–83d are formed of polysilicon films, respectively. A beam 84 is suspended between the anchors 83a and 83c, while a beam 85 is suspended between the anchors 83b and 83d. A rectangular mass 86 is further suspended between the beams 84 and 85. The mass 86 is formed with through holes 86a. Further, a number of exciting movable electrodes 87 project from one side (left side in FIG. 29) of the mass 86. The movable electrodes 87 are each rod-shaped and extend in parallel to each other at regular intervals therebetween. Similarly, a number of exciting movable electrodes 88 project from the other side (right side in FIG. 29) of the mass 86. The movable electrodes 88 are each rod-shaped and extend in parallel to each other at regular intervals therebetween. The beams 84 and 85, the mass 86 and the movable electrodes 87 and 88 are movable after partly removing a sacrificial oxide layer 89 by etching. The etched region is shown by the dotted line Z2 in FIG. 29.

As described above, the beam structure 81 has the two comb-shaped movable electrodes, that is, the movable electrodes 87 as the first movable electrodes and the movable electrodes 88 as the second movable electrodes.

Since the beam structure 82 has the same structure as that of the beam structure 81, explanation thereof is omitted by assigning the same reference marks to the corresponding elements.

On the substrate 80 are disposed comb-shaped electrodes 90, 91 and 92 as exciting fixed electrodes. The comb-shaped electrode 90 has rod electrodes 90a at one side thereof. The comb-shaped electrode 91 has rod electrodes 91a and 91b at both sides thereof. The comb-shaped electrode 92 has rod electrodes 92a at one side thereof. The comp-shaped electrodes 90–92 are made of monocrystalline silicon. The comb-shaped electrodes 90–92 are supported and fixed by anchors 93, 94 and 95, respectively, which project from the substrate 80. The rod electrodes 90a of the comb-shaped electrode 90 are disposed so as to face the corresponding movable electrodes 87 of the beam structure 81, respectively. The rod electrodes 91a of the comb-shaped electrode 91 are disposed so as to face the corresponding movable electrodes 88 of the beam structure 81, respectively. The rod electrodes 91b of the comb-shaped electrode 91 are disposed so as to face the corresponding movable electrodes 87 of the beam structure 82, respectively. The rod electrodes 92a of the comb-shaped electrode 92 are disposed so as to face the corresponding movable electrodes 88 of the beam structure 82, respectively.

In this embodiment, the comb-shaped electrode 90 constitutes the first exciting fixed electrodes and the comp-shaped electrode 91 constitutes the second exciting fixed electrodes.

As shown in FIG. 29, at a region of the substrate 80 facing a portion (mainly, the mass 86) of the beam structure 81, a lower electrode (yaw rate detecting fixed electrode) 101 is arranged as a physical quantity detecting fixed electrode.

Similarly, at a region of the substrate 80 facing a portion (mainly, the mass 86) of the beam structure 82, a lower electrode (yaw rate detecting fixed electrode) 102 is arranged as a physical quantity detecting fixed electrode. A first capacitor is defined between the beam structure 81 and the lower electrode 101, and a second capacitor is defined between the beam structure 82 and the lower electrode 102.

By applying electrostatic forces in opposite phases between the movable electrodes 87 of the beam structure 81 and the comb-shaped electrode 90 and between the movable electrodes 88 of the beam structure 81 and the comb-shaped electrode 91, the beam structure 81 is subjected to forced vibration (excitation). Similarly, by applying electrostatic forces in opposite phases between the movable electrodes 87 of the beam structure 82 and the comb-shaped electrode 91 and between the movable electrodes 88 of the beam structure 82 and the comb-shaped electrode 92, the beam structure 82 is subjected to forced vibration (excitation). During the excitation, the yaw rates applied to the beam structures 81 and 82 can be detected based on capacitances Co of the first and second capacitors formed between the beam structure 81 and the lower electrode 101 and between the beam structure 82 and the lower electrode 102.

As shown in FIG. 30, the substrate 80 has a laminated structure, wherein a lower layer insulating film 97, conductive films 98 and an upper layer insulating film 99 are laminated on a silicon substrate (semiconductor substrate) 96 in the order named. In other words, a laminated structure 100 composed of the lower layer insulating film 97, the conductive films 98 and the upper layer insulating film 99 is disposed on the silicon substrate 96, wherein the conductive films 98 are buried between the insulating films 97 and 99. The lower layer insulating film 97 is made of silicon oxide, while the upper layer insulating film 99 is made of silicon nitride. The insulating films 97 and 99 are formed through CVD or the like. On the other hand, the conductive films 98 are made of impurity doped polysilicon.

The conductive films 98 form the lower electrodes 101 and 102 and wiring patterns 103 and 104 shown in FIG. 29.

As shown in FIGS. 29 and 31, electrode connecting portions 105 and 106 (electrical connecting members) made of monocrystalline silicon are provided so as to be supported by anchors 107 and 108 projecting from the substrate 80.

As shown in FIG. 31, the upper layer insulating film 99 is formed with an opening 109 in which the anchor (impurity doped polysilicon) 107 is disposed. Accordingly, the lower electrode 101 is electrically connected to the electrode connecting portion 105 through the wiring pattern 103 and further through the opening 109 and the anchor (impurity doped polysilicon) 107. Similarly, the lower electrode 102 is electrically connected to the electrode connecting portion 106 through the wiring pattern 104 and further through the anchor (impurity doped polysilicon) 108.

As shown in FIG. 29, the anchors 93–95 of the comb-shaped electrodes 90–92 and the anchors 83a–83d of the beam structures 81 and 82 are in the form of buried members 110 formed by the conductive films 98.

Accordingly, the substrate 80 is so arranged that the lower electrodes 101 and 102 and the wiring patterns 103 and 104 made of polysilicon are buried under the SOI layers. This structure is achieved using the surface micro-machining technique.

On the other hand, as shown in FIG. 32, aluminum film electrodes (bonding pads) 111, 112 and 113 are provided on the comb-shaped electrodes 90–92, respectively. Further, aluminum film electrodes (bonding pads) 114 and 115 are provided above the anchors 83a of the beam structures 81 and 82. As shown in FIG. 31, aluminum film electrodes (bonding pads) 116 are provided on the electrode connecting portions 105 and 106, respectively. On the electrode connecting portions 105 and 106, layer insulation films 118 and silicon nitride films 117 are further formed, respectively.

By using the lower electrodes 101 and 102 and the wiring patterns 103 and 104 each of which is separated by the insulators, the aluminum electrodes (bonding pads) 116 can be achieved through the surface of the substrate.

Now, an operation of the yaw rate sensor thus structured will be described hereinbelow with reference to FIG. 33.

First, voltages are applied between the comb-shaped electrodes (exciting fixed electrodes) 90–92 and the exciting movable electrodes 87 and 88 so as to vibrate the masses 86 of the beam structures 81 and 82 in directions Y in FIG. 29 parallel to the surface of the substrate. At this time, if a yaw Ω is generated in a direction parallel to the surface of the substrate and perpendicular to the vibration directions (directions Y), a Coriolis force perpendicular to the surface of the substrate is applied to the masses 86 of the beam structures 81 and 82 (see FIG. 29). Displacement of the masses 86 of the beam structures 81 and 82 caused by the Coriolis force is detected as changes of the capacitances Co.

A Coriolis force fc depends on a mass m of the mass 86 of the beam structure 81, 82, a velocity V of vibration and a yaw Ω, and is given by the following equation:

$$fc = 2\ mV\Omega$$

During vibration in the directions parallel to the surface of the substrate, the velocity of the mass 86 of the beam structure 81, 82 is 0 (zero) at the fixed ends thereof, while becomes maximum at the center thereof. This also applies to the Coriolis force. Accordingly, displacement in the directions perpendicular to the surface of the substrate is also 0 at the fixed ends, while becomes maximum at the center so that each mass 86 draws an oval. By offsetting the vibration phases of the masses 86 by 180 degrees, the displacement directions become opposite to each other so that a differential detection is made possible. If only one of the masses 86 is used (that is, if the differential excitation is not performed), the Coriolis force and the acceleration caused by vibration or others can not be separated. On the other hand, by performing the differential detection, noise components caused by the acceleration can be canceled. Since, in general, the Coriolis force is very small, the effect of the resonance is utilized. Specifically, for increasing the velocity V of the foregoing equation, the excitation of each mass 86 in the directions parallel to the surface of the substrate is performed at a resonance frequency so as to enlarge amplitudes. Since the Coriolis force is generated at the same period as that of the vibration, the displacement caused by the Coriolis force can be increased by setting the same resonance frequency as that of the excitation in the detecting directions perpendicular to the surface of the substrate.

Figure 33:
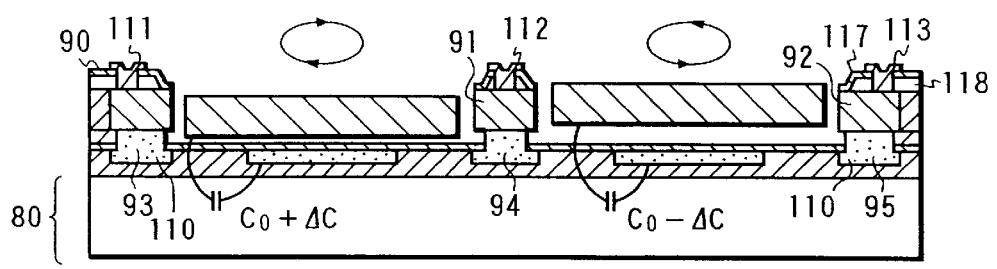
FIG. 33 is a diagram for explaining an operation of the yaw rate sensor shown in FIG. 29, wherein $\Omega \neq 0$.
Figure 34:
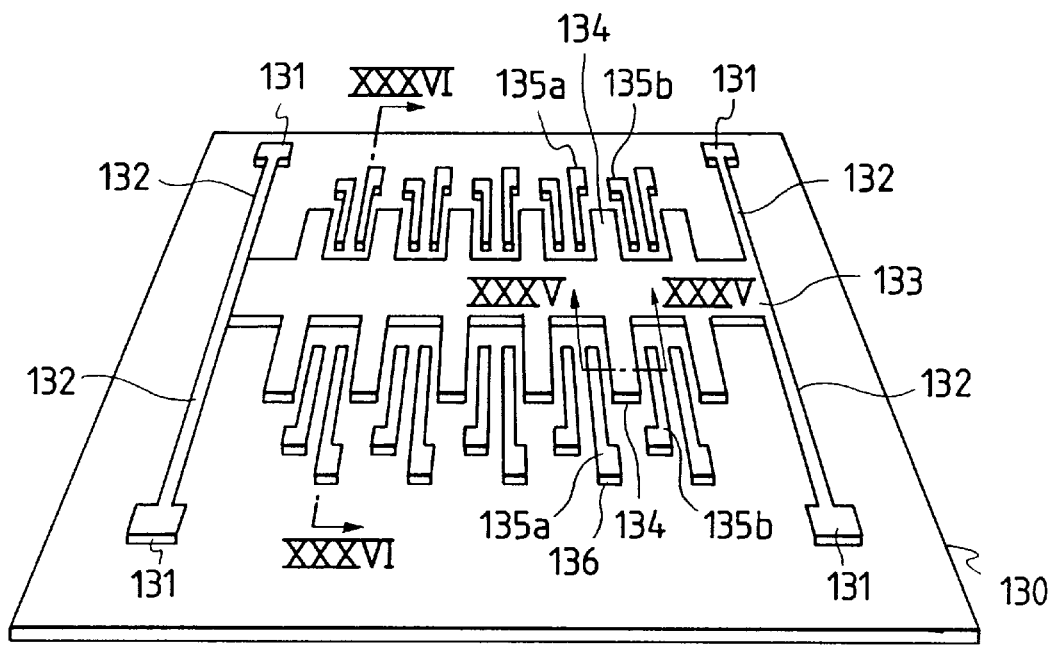
FIG. 34 is a perspective view showing a conventional acceleration sensor.
Figure 35:
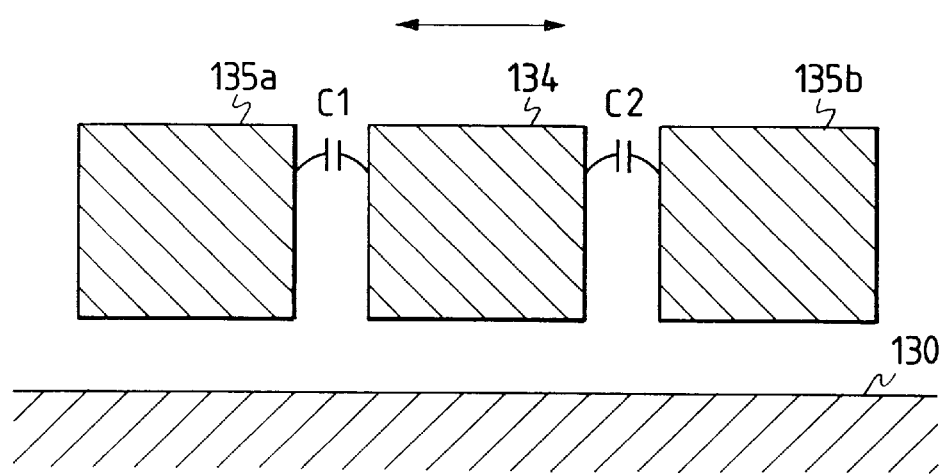
FIG. 35 is a sectional view taken along line XXXV—XXXV in FIG. 34.
Figure 36:
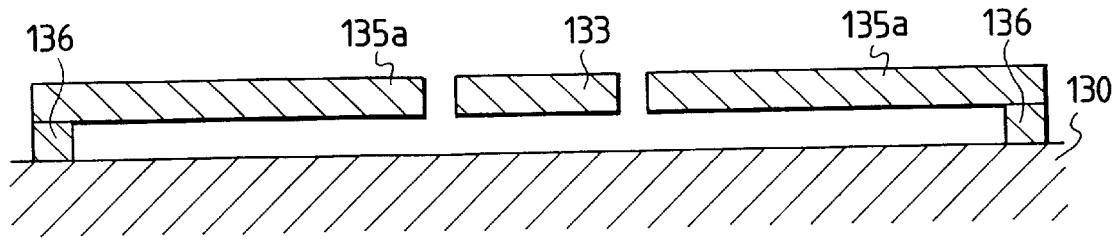
FIG. 36 is a sectional view taken along line XXXVI—XXXVI in FIG. 34.
Figure 37:
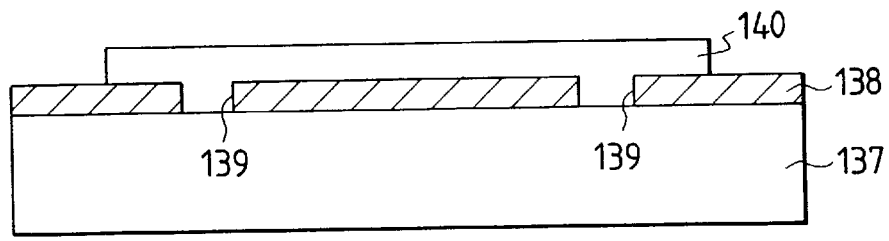
FIGS. 37 and 38 are diagrams for explaining a fabrication process of the acceleration sensor shown in FIG. 34.
Figure 38:
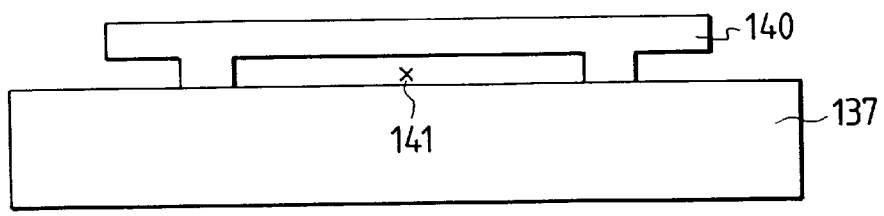
Figure 39:
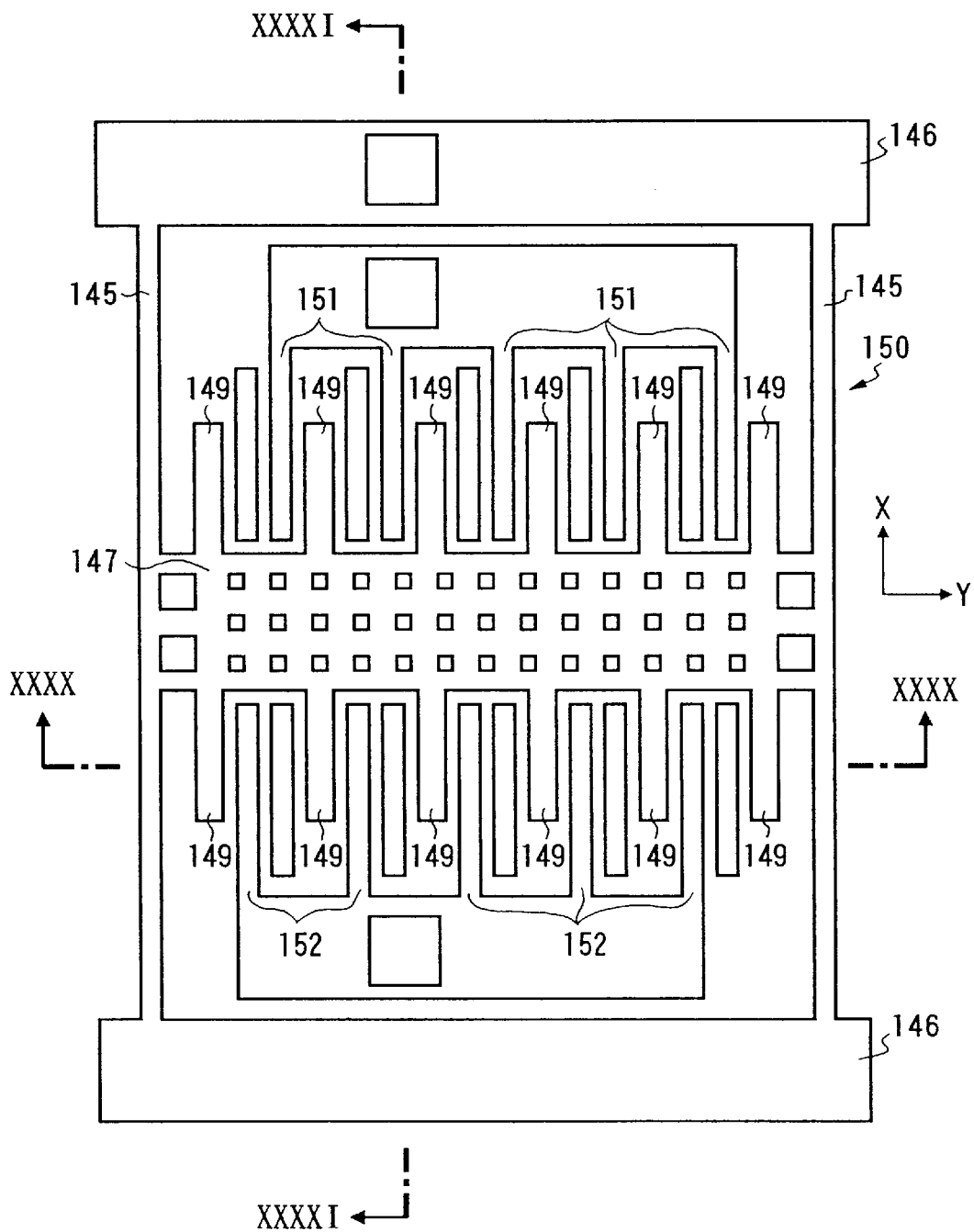
FIG. 39 is a plan view showing another conventional acceleration sensor.
Figure 40:
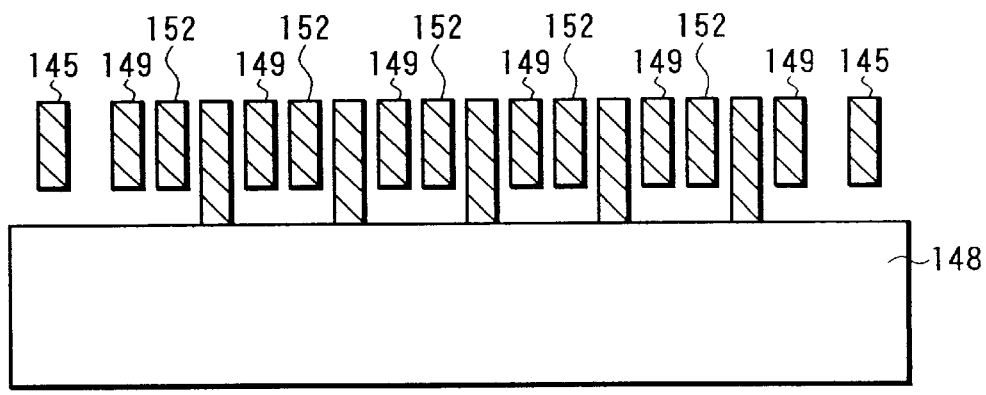
FIG. 40 is a sectional view taken along line XXXX—XXXX in FIG. 39.
Figure 41:
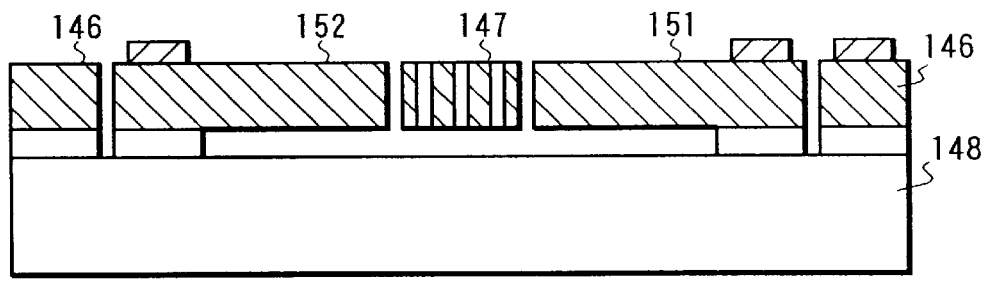
FIG. 41 is a sectional view taken along line XXXXI—XXXXI in FIG. 39.

It is assumed that the capacitances are changed to Co+ΔC (first capacitor) and Co−ΔC (second capacitor) due to gap changes caused by the Coriolis force as shown in FIG. 33. In this case, if the gap change is sufficiently small as compared with an initial value, fc 2ΔC, and thus Ω 2ΔC. Accordingly, the yaw can be detected based on variations of the two capacitances.

The yaw rate sensor described above can be fabricated in the same manner as that of the foregoing first or second preferred embodiment.

According to this embodiment, the following advantages can be achieved:

The laminated structure 100 of the lower layer insulating film 97, the conductive films 98 and the upper layer insulating film 99 is disposed at the upper portion of the substrate 80. The conductive films 98 form the lower electrode (physical quantity detecting fixed electrode) 101 (102) and the wiring pattern 103 (104) for the lower electrode. Via the opening 109 formed in the upper layer insulating film 99, the lower electrode 101 (102) is electrically connected to the electrode pick-up portion 105 (106) through the wiring pattern 103 (104). In this manner, by disposing the insulating films at the upper portion of the substrate 80 and burying the lower electrode and the wiring pattern between the insulating films, the wiring and the electrode separated by the insulators can be achieved.

Employing the SOI substrate (buried SOI substrate) where the buried films (polysilicon) are used as the lower electrodes 101 and 102 and the wiring therefor, the electrodes and the wiring therefor separated by the insulators can be formed. Accordingly, as compared with using the impurity diffusion layer 161 (pn junction separation) shown in FIG. 48, reduction in junction leak can be achieved. Particularly, reduction in junction leak at high temperatures can be achieved.

While the present invention has been described in terms of the preferred embodiments, the invention is not to be limited thereto, but can be embodied in various ways without departing from the principle of the invention as defined in the appended claims.

For example, in the foregoing acceleration sensors, the servo control is performed. On the other hand, the present invention is also applicable to such a sensor that detects a displacement as a change in capacitance. Further, the present invention is also applicable to such a semiconductor physical quantity sensor that detects a physical quantity, such as vibration, other than acceleration and yaw rate.

What is claimed is:

1. A semiconductor physical quantity sensor comprising:
   a substrate;
   a beam structure made of a monocrystalline semiconductor material and spacing a given distance from an upper surface of said substrate so as to be displaceable in response to an applied physical quantity; and
   a fixed electrode fixed to the upper surface of said substrate and facing at least a portion of said beam structure,
   wherein a laminated structure including a lower layer insulating film, a conductive film and an upper layer insulating film is provided at an upper portion of said substrate, and wherein said conductive film forms wiring or an electrode which is electrically connected to an electrical connecting member arranged at the upper surface of said substrate, via an opening formed in said upper layer insulating film, and further wherein said conductive film has a portion which projects through an opening in said upper layer insulating film to a level above said upper layer insulating film and said fixed electrode is connected to said conductive film portion so as to be spaced a distance above said upper layer insulating film.

2. The semiconductor physical quantity sensor according to claim 1, wherein said beam structure is made of monocrystalline silicon.

3. The semiconductor physical quantity sensor according to claim 1, wherein said conductive film is made of polysilicon.

4. A semiconductor physical quantity sensor comprising:
   a substrate;
   a beam structure made of a monocrystalline semiconductor material and spacing a given distance from an upper surface of said substrate, said beam structure having movable electrodes extending in parallel to each other;
   first fixed electrodes fixed to the upper surface of said substrate and each facing one side of corresponding one of said movable electrodes; and
   second fixed electrodes fixed to the upper surface of said substrate and each facing the other side of corresponding one of said movable electrodes,
   each of said movable electrodes and the corresponding first fixed electrode forming a first capacitor, and each of said movable electrodes and the corresponding second fixed electrode forming a second capacitor,
   wherein a laminated structure including a lower layer insulating film, a conductive film and an upper layer insulating film is arranged at an upper portion of said substrate, wherein said conductive film forms at least one of a wiring pattern for said first fixed electrodes and a wiring pattern for said second fixed electrodes, and wherein said at least one of said wiring patterns is electrically connected to the corresponding first or second fixed electrodes, respectively, via openings formed in said upper layer insulating film and anchors of said corresponding first or second fixed electrodes.

5. The semiconductor physical quantity sensor according to claim 4, wherein said beam structure is made of monocrystalline silicon.

6. The semiconductor physical quantity sensor according to claim 4, wherein said conductive film is made of polysilicon.

7. The semiconductor physical quantity sensor according to claim 4, wherein voltages applied across said first and second capacitors are controlled so as not to displace said movable electrodes against the applied physical quantity, and wherein said applied physical quantity is detected based on said controlled voltages.

8. A semiconductor physical quantity sensor comprising:
   a substrate;
   a beam structure made of a monocrystalline semiconductor material and spacing a given distance from an upper surface of said substrate, said beam structure having movable electrodes extending in parallel to each other;
   first fixed electrodes fixed to the upper surface of said substrate and each facing one side of corresponding one of said movable electrodes;
   second fixed electrodes fixed to the upper surface of said substrate and each facing the other side of corresponding one of said movable electrodes; and
   an electrostatic force preventing fixed electrode formed at a region of said substrate facing said beam structure,
   wherein a physical quantity applied to said beam structure is detected based on a capacitance of a first capacitor formed between each of said movable electrodes and the corresponding first fixed electrode and a capacitance of a second capacitor formed between each of said movable electrodes and the corresponding second fixed electrode, wherein generation of electrostatic forces between said beam structure and said substrate is prevented by setting said beam structure and said electrostatic force preventing fixed electrode to be equipotential to each other, wherein a laminated structure including a lower layer insulating film, conductive films and an upper layer insulating film is arranged at an upper portion of said substrate, wherein said conductive films form at least one of a wiring pattern for said first fixed electrodes and a wiring pattern for said second fixed electrodes and further form said electrostatic force preventing fixed electrode, wherein said at least one of said wiring patterns is electrically connected to the corresponding first or second fixed electrodes, respectively, via openings formed in said upper layer insulating film and anchors of said corresponding first or second fixed electrodes, and wherein said electrostatic force preventing fixed electrode is electrically connected to said beam structure via an opening formed in said upper layer insulating film and an anchor of said beam structure.

9. The semiconductor physical quantity sensor according to claim 8, wherein said beam structure is made of monocrystalline silicon.

10. The semiconductor physical quantity sensor according to claim 8, wherein said conductive films are made of polysilicon.

11. The semiconductor physical quantity sensor according to claim 8, wherein voltages applied across said first and second capacitors are controlled so as not to displace said movable electrodes against the applied physical quantity, and wherein said applied physical quantity is detected based on said controlled voltages.

* * * * *